(12) United States Patent
Lin

(10) Patent No.: US 12,549,102 B2
(45) Date of Patent: Feb. 10, 2026

(54) LOW-POWER CONTINUOUS-RAIL SWITCHING REGULATOR ARCHITECTURE

(71) Applicant: Cypress Semiconductor Corporation, San Jose, CA (US)

(72) Inventor: Adrian Lin, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 352 days.

(21) Appl. No.: 18/307,545

(22) Filed: Apr. 26, 2023

(65) Prior Publication Data
US 2024/0364217 A1    Oct. 31, 2024

(51) Int. Cl.
*H02M 1/00* (2007.01)
*H02M 3/157* (2006.01)

(52) U.S. Cl.
CPC ......... *H02M 3/157* (2013.01); *H02M 1/0009* (2021.05); *H02M 1/0012* (2021.05)

(58) Field of Classification Search
CPC ... H02M 3/157; H02M 1/0009; H02M 1/0012
USPC ....................................... 323/283
See application file for complete search history.

(56) References Cited

U.S. PATENT DOCUMENTS

| | | | |
|---|---|---|---|
| 6,282,146 B1* | 8/2001 | Guo | H03K 19/00315 365/230.06 |
| 7,271,632 B2* | 9/2007 | Cottin | H03K 4/502 327/131 |
| 7,671,575 B1* | 3/2010 | Suzuki | H05B 45/3725 323/284 |
| 8,149,047 B2* | 4/2012 | Tsai | H03F 3/345 327/539 |
| 9,921,595 B2* | 3/2018 | Nakamoto | G05F 1/56 |

* cited by examiner

*Primary Examiner* — Thienvu V Tran
*Assistant Examiner* — Lauren Ashley Shaw

(57) ABSTRACT

A floating-rail voltage generator and method are provided for use in a switched regulator. Generally, the generator includes a floating-rail reference generator, a current-sinking buffer and a current-sink. The reference generator is operable to generate a reference voltage ($V_{SSHV\_REF}$) equal to an input voltage ($V_{BAT}$) minus 1.8 V for $V_{BAT}$ between 1.8V and 4.8V, and equal to 0V for $V_{BAT}$ less than 1.8V. The buffer is coupled between $V_{BAT}$ and ground, and operable to receive the $V_{SSHV\_REF}$ and generate a continuous floating-rail voltage ($V_{SSHV}$) on a floating-rail for $V_{BAT}$ between 1.6V and 4.8V. The current-sink is operable to receive $V_{SSHV\_REF}$ and $V_{SSHV}$, and to turn on a current sinking switch coupled between the floating-rail and ground by setting a set-reset latch having a latch output coupled to a gate of the current sinking switch when a transient load current signal is received from a load coupled to the floating-rail.

20 Claims, 16 Drawing Sheets

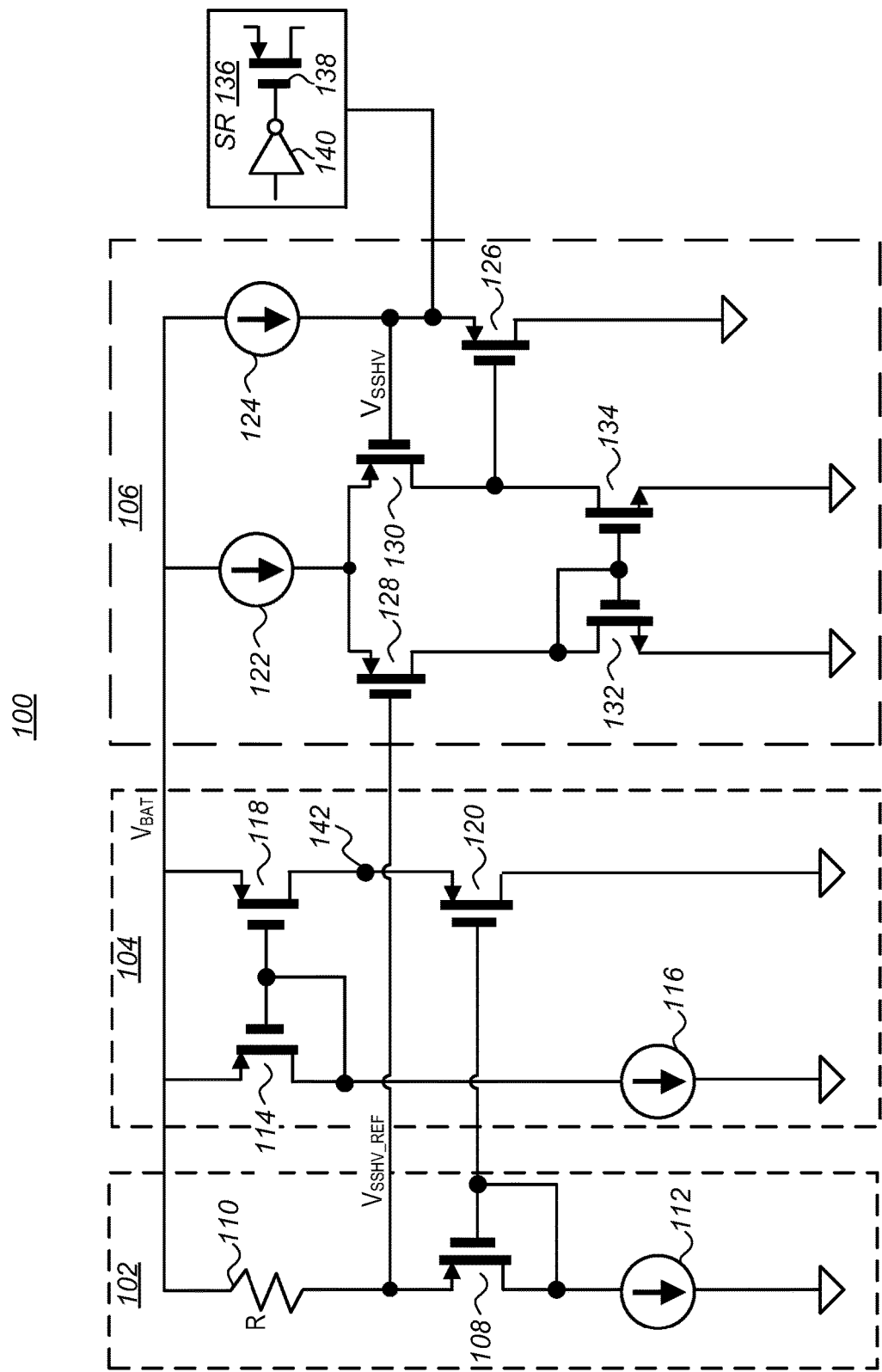
FIG. 1
(conventional)

LOW-POWER CONTINUOUS-RAIL SWITCHING REGULATOR ARCHITECTURE

TECHNICAL FIELD

This present disclosure relates generally to switching regulators, and more particularly to a low-power continuous-rail switching regulator and method of operating the same.

BACKGROUND

Many electronic products, such as Bluetooth radios, automotive infotainment systems, and Wi-Fi hubs and receivers include microcontroller units (MCU) or programmable systems on a chip (PSoC), in which a processor unit, memory, and communication interfaces and peripherals are integrally formed as a single integrated circuit (IC) or die with a power management unit (PMU) or Switching Regulator (SR) designed to provide stable, noise free DC voltage to logic devices in the IC. Typically, the logic devices are fabricated using metal-oxide semiconductor field-effect (MOS) transistors capable of operating with gate-to-source voltage of about 1.8 volts (V) across their gate oxides (Gox), i.e., 1.8 V Gox devices. In the past the PMU or SR could be fabricated on the same IC using 2.5 V Gox devices, which were required to allow continuous operation at battery or DC input voltages ranging from 1.6 V to 4.8 V. However, as semiconductor fabrication technologies shrink the size of logic MOS devices to 28 nanometers (nm) or 22 nm and beyond, process limitations prevents the use of 2.5 V Gox and 1.8 V Gox devices in the same die, thus only 1.8 V Gox devices are available to use for both the logic devices of the MCU and power transistors or devices of the PMU or SR. With only 1.8 V Gox devices available for use, the PMU or SR must use a floating-rail architecture to limit the gate-to-source voltage across the power transistors or devices to 1.8 V. However, this 1.8 V Gox limitation will limit a minimum battery or DC input voltage of state-of-the-art floating-rail architectures.

FIG. 1 is a schematic diagram of conventional reference and current sinking circuits in a floating-rail circuit used with or in a conventional PMU or SR. Referring to FIG. 1 the floating-rail circuit 100 generally includes a floating-rail reference generator 102 for generating a floating-rail reference voltage ($V_{SSHV\_REF}$), a floating-rail buffer 104 for sinking light or small transients in a load current of a circuit or load coupled to a floating-rail voltage ($V_{SSHV}$) on the floating-rail, and a current sink 106 for sinking large transients in load current.

As in the embodiment shown the floating-rail reference generator 102 generally includes a diode connected p-type or p-channel MOS (PMOS) transistor 108 with a source coupled through a resistor 110 having a resistance R to a DC input or battery voltage ($V_{BAT}$), and a drain coupled through a current source ($I_{bias1}$ 112) to a ground and to a gate of the transistor 108. A floating-rail reference voltage ($V_{SSHV\_REF}$) is taken from a node between the resistor 110 and transistor 108, and is generally equal to $V_{BAT} - I_{bias1} \cdot R$.

The floating-rail buffer 104 generally includes a pair of PMOS transistors functioning as a first current mirror having a diode connected first transistor 114 with a source coupled to $V_{BAT}$ and a drain coupled through a current source 116 to ground and to the gate of the first transistor 114 as well as to a gate of a second transistor 118 of the pair. The second transistor 118 has a source coupled to $V_{BAT}$, and a drain coupled to a source of a PMOS third transistor 120. The third transistor 120 has a drain coupled to ground, and a gate coupled to the gate and drain of the transistor 108 in the floating-rail reference generator 102 to form a second current mirror.

The current sink 106 generally includes a first current source 122 and a second current source 124 coupled in parallel to a DC input voltage ($V_{BAT}$), a differential amplifier coupled between the first current source 122 and ground, and a first PMOS transistor 126 coupled between the second current source 124 and ground, and having a gate coupled to an output of the differential amplifier. The differential amplifier includes second and third PMOS transistors 128, 130, that have sources coupled in parallel to the first current source 122 and drains coupled to ground through a current mirror or sink formed by a diode connected first n-type or n-channel MOS (NMOS) transistor 132 and a second NMOS transistor 134.

In operation a floating-rail reference voltage ($V_{SSHV\_REF}$) is applied to a first input of the differential amplifier, a gate of the second PMOS transistor 128, and the output of the differential amplifier on the drain of the third PMOS transistor 130 is coupled to the gate of the first PMOS transistor 126, which functions as a PMOS voltage follower to generate a floating-rail voltage ($V_{SSHV}$) on a node between the source of the first PMOS transistor and the second current source 124. $V_{SSHV}$ is also coupled to a gate of the third PMOS transistor 130, which forms a second input of the differential amplifier, to a power amplifier or switching transistor in the PMU or SR 136, which is represented in this figure by a PMOS transistor 138 and an inverter 140.

The floating-rail circuit 100 described above, while satisfactory under normal operating conditions, is subject to a number of disadvantages or limitations.

Firstly, one problem or limitation with the above described floating-rail reference generator 102, is that a drain source voltage (Vdsat) of the current source 112 and a diode voltage of the transistor 108, limit the minimum $V_{BAT}$ to 2.7 V in order to maintain the $V_{SSHV\_REF}$ at 1.8 V below $V_{BAT}$.

Another problem or limitation with the Floating-rail buffer 104 is that under normal operating conditions, i.e., no transients in load current ($I_{LOAD}$) and $I_{bias}$ matches $I_{LOAD}$, the transistor 120 functions as a PMOS voltage follower, such that a replica reference voltage ($V_{SSHAOP\_int}$) taken from a node 142 between transistors 118, 120, follows $V_{SSHV\_REF}$ ($V_{SSHAOP\_int} \approx V_{SSHV\_REF} = V_{BAT} - I_{bias} \cdot R$). However, because the floating-rail buffer 104 forms an unregulated, open-loop circuit this relationship is true only under perfect matching conditions.

A further limitation of the floating-rail buffer 104 of FIG. 1 is that to enable fast transient load current sinking requires high quiescent currents through transistor 120, resulting in the need for high quiescent currents is the current sources 112, 116, increasing the power consumed by the floating-rail reference generator 102 and the floating-rail buffer, thereby reducing an overall efficiency of the floating-rail circuit 100.

The current sink 106 also suffers from high quiescent currents through the first and second current sources 122, 124, as a result of the need for a high currents through transistor 126 to enable fast sinking of large transient in load current, further reducing the efficiency of the floating-rail circuit.

Finally, the floating-rail voltage ($V_{SSHV}$) generated needs to be able to go to 0 V in order to satisfy the above described 1.8 V limitation on Gox by maintaining $V_{SSHV}$ at 1.8 V below $V_{BAT}$ while allowing continuous operation at battery voltages ranging from 1.6 V to 4.8 V. However, the minimum $V_{SSHV}$ that can be generated is limited by a diode voltage of transistor 126 and a drain-source voltage (Vdsat) of transistor 134. Thus, a minimum operating battery voltage is limited to 2.7 V.

Accordingly, there is a need for a floating-rail circuit including a reference generator capable of providing a stable $V_{SSHV\_REF}$ at battery voltages below 2.7 V. There is a further need for a floating-rail circuit including a floating-rail buffer capable of rapidly sinking transients in a current load ($I_{LOAD}$) to provide a stable $V_{OUT}$ equal to $V_{SSHV\_REF}$ when $I_{LOAD}$ is not matched to the bias current ($I_{bias}$). It is further desirable that the floating-rail circuit is capable of operating at low power without requiring high quiescent $I_{bias}$ currents, and is capable of generating and maintaining a floating-rail voltage ($V_{SSHV}$) as low as 0 V while allowing continuous operation at battery voltages ranging from 1.6 V to 4.8 V.

SUMMARY

A floating-rail voltage generator and method for operating the same are provided. The generator and method are particularly useful in power management units (PMU) or switching regulators (SR) including a high-side switching transistor, such as a laterally-diffused p-channel metal-oxide semiconductor or LDPMOS.

Generally, the floating-rail voltage generator includes a floating-rail reference generator, a current-sinking (I-sink) buffer and a current-sink. The floating-rail voltage reference generator is operable to generate a reference voltage ($V_{SSHV\_REF}$) equal to an input voltage ($V_{BAT}$) minus 1.8 V for $V_{BAT}$ between 1.8 V and 4.8 V, and a $V_{SSHV\_REF}$ equal to 0 V for $V_{BAT}$ less than 1.8 V. The I-sink buffer is coupled between $V_{BAT}$ and ground, and operable to receive the $V_{SSHV\_REF}$ and generate a continuous floating-rail voltage ($V_{SSHV}$) on a floating-rail for $V_{BAT}$ between 1.6 V and 4.8 V. The current-sink is operable to receive $V_{SSHV\_REF}$ and $V_{SSHV}$, and to turn on a current sinking switch coupled between the floating-rail and ground by setting a set-reset latch having a latch output coupled to a gate of the current sinking switch when a transient load current signal is received from a load coupled to the floating-rail.

In one embodiment, the floating-rail voltage generator includes a tracking current source coupled in series with a current scaling resistor between an input voltage ($V_{BAT}$) and ground. The tracking current source includes a pair of MOS transistors having a first transistor coupled between the input voltage ($V_{BAT}$) and the output and a second transistor, and a differential amplifier having an output coupled to gates of the first and second transistors and operable to control the first and second transistors. Generally, the differential amplifier includes an inverting input coupled to the input voltage ($V_{BAT}$) through a first resistor (R1) of a voltage divider and to ground through a second resistor (R2) of the voltage divider, and a non-inverting input on which the reference voltage is applied coupled to a drain of the second transistor and to ground through a third resistor (R3).

In another embodiment, the I-sink buffer includes a one-stage differential amplifier having a first closed-loop operable to provide to the output a buffered output voltage ($V_{OUT}$) that tracks a reference voltage ($V_{SSHV\_REF}$) received on an input of the buffer, and a second closed-loop operable to sink at least a portion of a load current ($I_{LOAD}$) in the load to ground during transients in the load current. The current-sink buffer further includes a first current source coupled to an input voltage ($V_{BAT}$) and operable to generate a biasing current ($I_{bias}$), and the one-stage differential amplifier is coupled to $V_{BAT}$ through the first current source.

In still other embodiments, the current-sink includes a dynamically controlled latch system having a latch system input operable to receive a transient load current signal from the load coupled to the floating-rail, and a current sinking switch coupled between the floating-rail and ground. The current sinking switch is controlled by a voltage output from a latch system output, and is operable to sink at least a portion of the transient load current from the load coupled to the floating-rail to provide a stable floating-rail voltage ($V_{SSHV}$).

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 1 is a schematic diagram of conventional floating-rail reference, buffer and current sink in a floating-rail circuit used with or in a conventional power management unit (PMU) or switching regulator (SR);

DETAILED DESCRIPTION

A low-power continuous-rail switching regulator and method for operating the same are provided. The switching regulator and methods of the present disclosure are particularly useful in portable and low-power applications such, as in a power management unit (PMU) or switching regulator (SR) for Bluetooth (BT) radios, Wi-Fi hubs or receivers, and other microcontroller units (MCU).

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to 'couple' as used herein can include both to directly electrically connect two or more components or elements and to indirectly connect through one or more intervening components.

Figure 2:
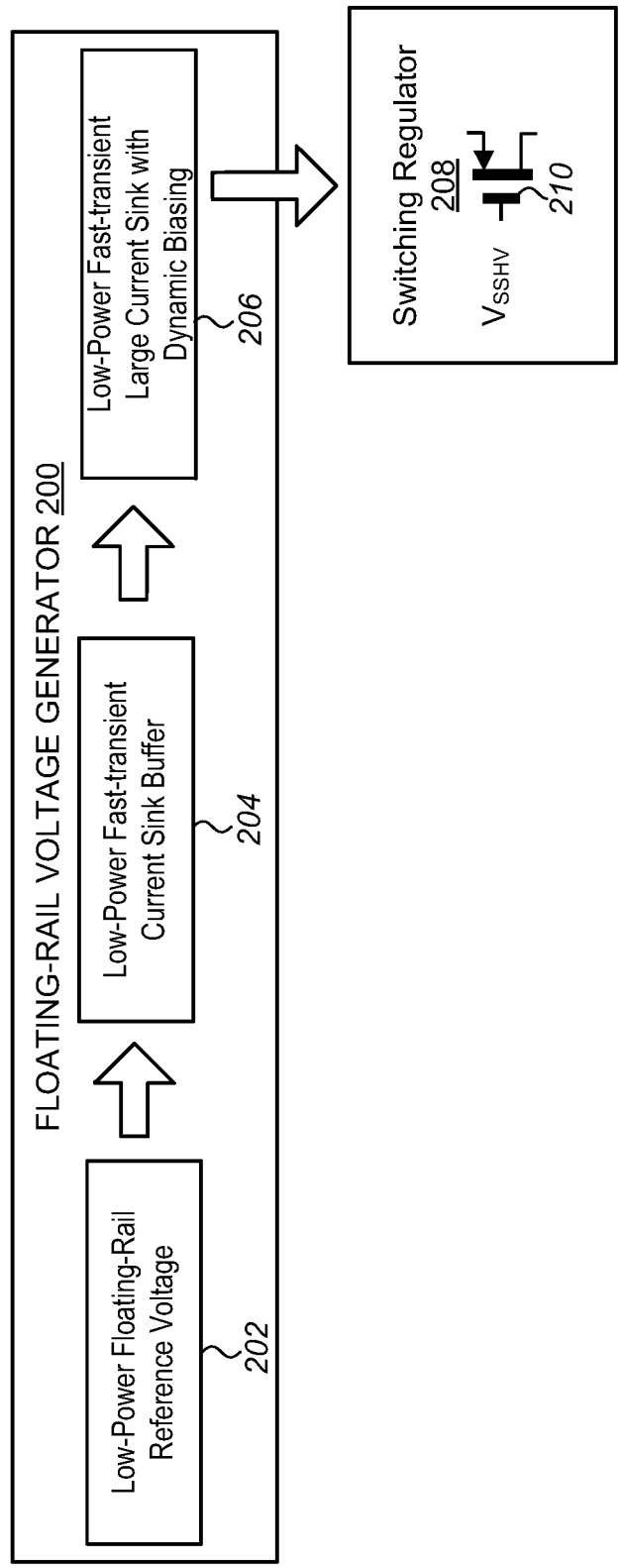
FIG. 2 is a block diagram of a low power, continuous, floating-rail voltage generator useful in or with a switching regulator (SR)

An embodiment of a continuous, floating-rail voltage generator 200 for use in or with a switching regulator (SR) will now be described with reference to FIG. 2. FIG. 2 is a block diagram of an embodiment of a continuous, floating-rail voltage generator 200 including three separate modules or blocks, each of which can be used individually in general circuit applications, or integrated into a single switching regulators (SR) having low-power consumption, while providing a stable floating-rail voltage ($V_{SSHV}$) over a battery voltage ($V_{BAT}$) ranging continuous from 1.6 V to 4.8 V. Referring to FIG. 2, floating-rail voltage generator 200 generally includes a floating-rail reference generator 202, a current-sinking (I-sink) buffer 204 and a current-sink 206.

The floating-rail voltage generator 200 can be coupled to a high-side switching transistor in a power management unit (PMU) or SR 208, represented in this figure by a laterally-diffused PMOS transistor (LDPMOS 210), as in the embodiment integrally formed within a PMU or SR as part thereof.

The floating-rail reference generator 202 is a low-power floating-rail reference generator and is operable to generate a floating-rail reference voltage ($V_{SSHV\_REF}$) equal to $V_{BAT}$-1.8 V for battery voltages between 1.8 V and 4.8 V (1.8 V≤$V_{BAT}$≤4.8 V), and a $V_{SSHV\_REF}$ of 0 V for battery voltages less than 1.8 V ($V_{BAT}$≤1.8 V). By low power it is meant the floating-rail reference generator 202 has a total current consumption of less than about 100 nanoampreres (nA).

The I-sink buffer 204 is operable to receive the $V_{SSHV\_REF}$ from the floating-rail reference generator 202, generate the floating-rail voltage ($V_{SSHV}$) and to sink transient load currents in a load coupled to a floating-rail supplied by the floating-rail voltage generator to provide a buffered, stable $V_{SSHV}$. The I-sink buffer 204 is also a low power I-sink buffer, having a total current consumption of less than about 25 nA, independent of the battery voltage $V_{BAT}$ and a load current of the load.

The current-sink 206 is a low-power, fast-transient large current sink with dynamic biasing that is operable to receive the $V_{SSHV\_REF}$ from the floating-rail reference generator 202 and the $V_{SSHV}$ from the I-sink buffer and provide fast current sinking of transient load currents from the LDPMOS 210 in the SR 208.

Each of these blocks, the floating-rail reference generator 202, I-sink buffer 204 and large transient current sink 206 will be described in further detail with reference to individual schematic circuit diagrams below.

Figure 3:
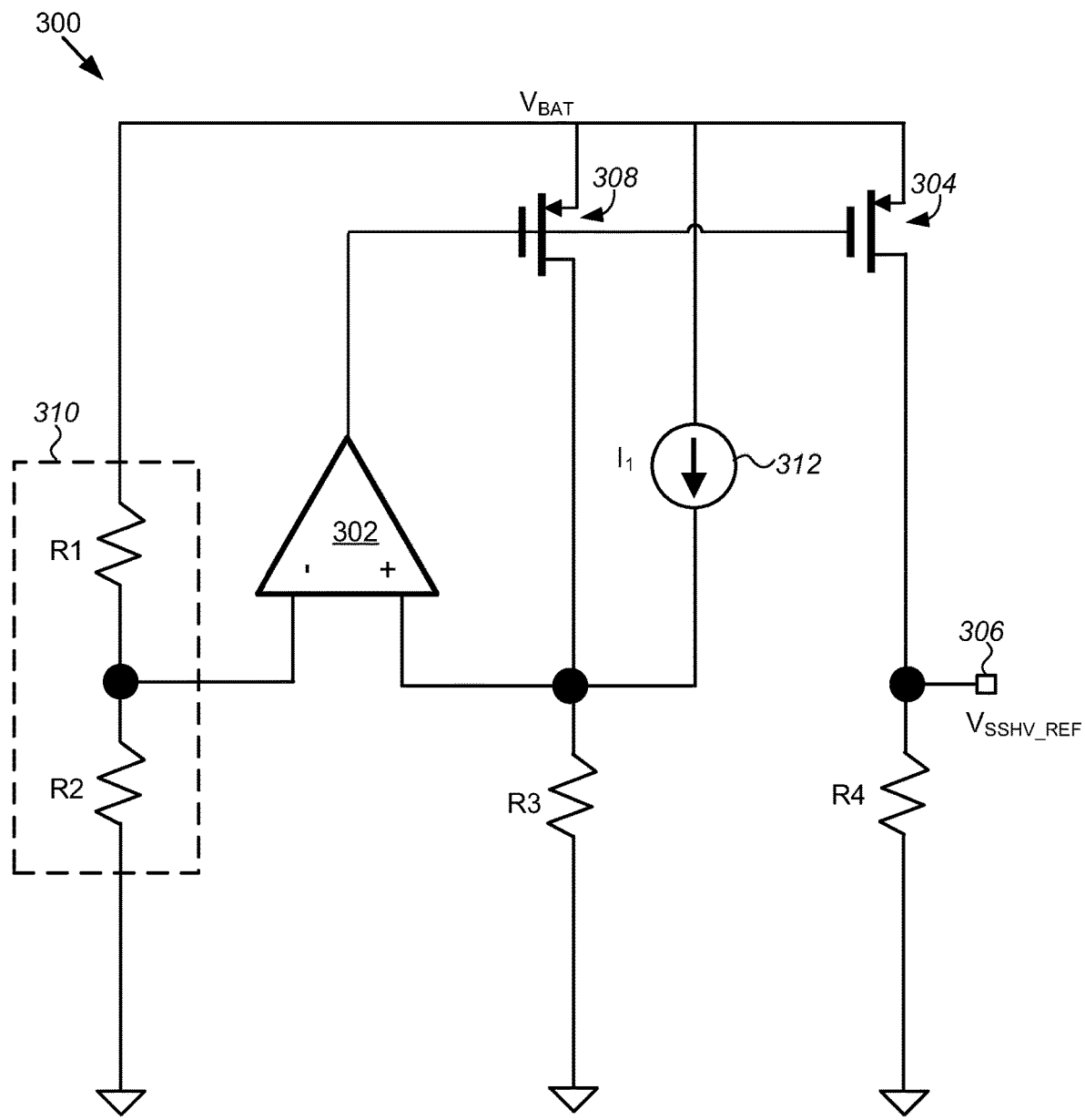
FIG. 3 is a schematic diagram of a low power floating-rail reference generator according to an embodiment of the present disclosure.

FIG. 3 is a schematic circuit diagram of a floating-rail reference generator 300 according to an embodiment in which a reference voltage is provided by an output of a differential amplifier 302 and the current source is implemented using a pair of transistors controlled by the differential amplifier. The pair of transistors include a first transistor 304 coupled between the input voltage ($V_{BAT}$) and an output 306, and a second transistor 308. In some embodiments, such as that shown, the pair of transistors includes p-type or p-channel MOS (PMOS) transistors.

The differential amplifier 302 can be implemented using a one-stage differential operational amplifier (OPAMP), as in the embodiment shown, or using a number of discrete transistors. In either case the differential amplifier 302 has an output coupled to gates of the first and second transistors 304, 308, and is operable to control the first and second transistors. The differential amplifier 302 can further include an inverting input coupled to the input voltage ($V_{BAT}$) through a first resistor (R1) of a voltage divider 310 and to ground through a second resistor (R2) of the voltage divider, and a non-inverting input coupled to a drain of the second transistor 308 and to ground through a third resistor (R3). The floating-rail reference voltage ($V_{SSHV\_REF}$) generated across a fourth resistor (R4) coupled between the output 306 and ground.

A floating-rail reference voltage ($V_{SSHV\_REF}$) for the floating-rail reference generator 300 can be calculated as shown in equation 1 below.

$$V_{SSHV\_REF} = \left(\frac{V_{BAT}}{k} - \frac{V_{GS}}{k}\right) \cdot \frac{1}{R} \cdot k \cdot R \quad (1)$$

where $V_{GS}$ is preselected maximum gate-source voltage for the fabrication process, k is a voltage scaling ratio, and R is a resistance of the current scaling resistor.

In this embodiment, for reasons given above the $V_{GS}$ of equation 1 is the desired maximum gate-source voltage for transistors formed by an allowable process (for example is selected to be 1.8 V for a 22 nm process), the voltage scaling ratio (k) is equal to a resistance of the second resistor (R2) divided by a sum of resistances of the first resistor (R1) and second resistor (R2) or k=R2/(R1+R2), and a resistance of the fourth resistor (R4), or current scaling resistor, is equal to a product of the resistance of the second resistor (R2) and a resistance of the third resistor (R3) divided by a sum of resistances of the first resistor (R1) and second resistor (R2).

Thus, the floating-rail reference voltage ($V_{SSHV\_REF}$) for the floating-rail reference generator 300 of FIG. 3 equals $V_{BAT}$-1.8 V for $V_{BAT}$ voltages between 1.8 V and 4.8 V, and $V_{SSHV\_REF}$ equals 0 V for $V_{BAT}$ less than 1.8 V. Additionally, it is noted that the floating-rail reference generator 300 is a low power floating-rail reference generator having a total current consumption less than about 100 nano-amperes (nA).

In the embodiment shown, the floating-rail reference generator 300 further includes a current source 312 through which the third resistor (R3) is coupled to $V_{BAT}$ to set the non-inverting input to the differential amplifier 302. The current source is selected or operated to have a predetermined current ($I_1$) as shown in equation 2 below.

$$I_1 = \frac{V_{GS}}{kR} = V_{GS}\left(\frac{R_1 + R_2}{R_2 R_3}\right) \quad (2)$$

where $V_{GS}$ is the desired maximum gate-source voltage, $R_1$ is the resistance of the first resistor, and $R_2$ is the resistance of the second resistor.

Figure 4:
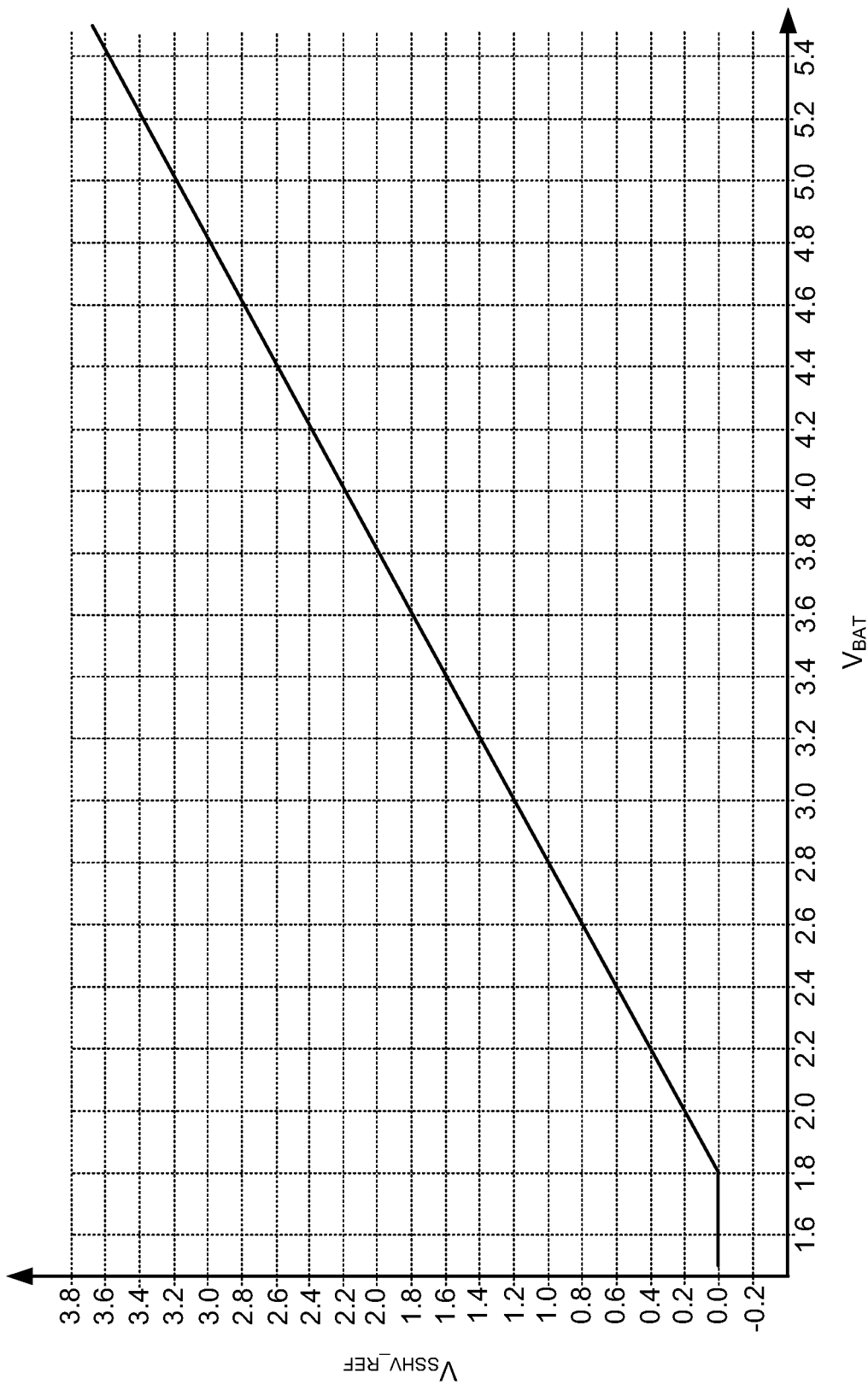
FIG. 4 is a graph of floating-rail voltage ($V_{SSHV}$) versus battery voltage ($V_{BAT}$) illustrating the ability of the floating-rail reference generator of the present disclosure to operate continuously with battery voltages from 1.6 V to 4.8 V.

FIG. 4 is a graph of floating-rail voltage ($V_{SSHV\_REF}$) versus battery voltage ($V_{BAT}$) illustrating the ability of the floating-rail reference generator of either FIG. 3 to operate continuously with battery voltages from 1.6 V to 4.8 V. In particular, it is noted that from the floating-rail reference generators of the present disclosure are operable to provide a stable $V_{SSHV\_REF}$ at battery voltages ($V_{BAT}$) from about 1.5 V to about 1.8 V, and steadily increasing $V_{SSHV\_REF}$ voltages equal to about $V_{BAT}$-1.8 V at battery voltages from about 1.8 V to about 4.8 V.

Figure 5:
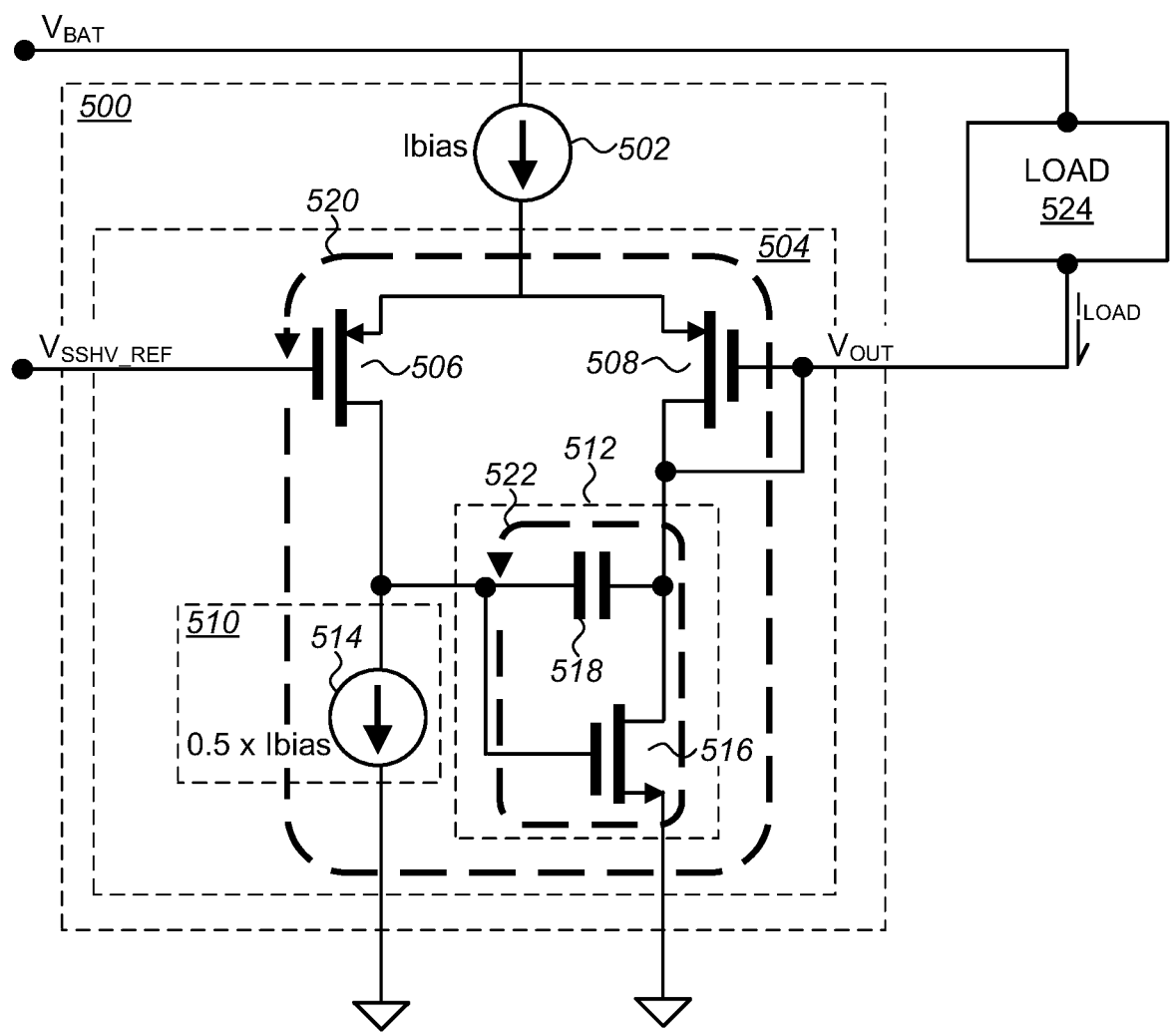
FIG. 5 is a schematic diagram of a low-power, fast-transient current-sink (I-sink) buffer according to an embodiment of the present disclosure.

An embodiment of a current-sink (I-sink) buffer 500 will now be described with reference to FIG. 5. FIG. 5 is a schematic block diagram of an embodiment of a current-sink (I-sink) buffer 500. Referring to FIG. 5, the I-sink buffer 500 generally includes a first current source 502 coupled to a DC input voltage ($V_{BAT}$) and operable to generate a biasing current ($I_{bias}$), and a one-stage, differential amplifier 504 coupled between the first current source and ground. The differential amplifier 504 includes a first transistor 506 having a gate coupled to a buffer input to receive floating-rail reference voltage ($V_{SSHV\_REF}$), and a source coupled to the first current source 502, and a second transistor 508 matched to the first transistor, having a source coupled to the first current source and to the source of the first transistor. The second transistor 508 is diode connected with a gate coupled to a drain and to a buffer output to output a buffered output voltage ($V_{OUT}$). As shown, the first and second transistor 506, 508, include p-type or p-channel MOS (PMOS) transistors.

The differential amplifier 504 further includes a first current sink 510 through which a drain of the first transistor 506 is coupled to ground, and a second current sink 512 through which the drain of the second transistor 508 is coupled to ground. The first current sink includes a second current source 514 through which a drain of the first transistor 506 is coupled to ground. The second current sink 512 includes a third transistor 516 having a source coupled to ground, a drain coupled to the drain of the second transistor 508, and a gate coupled to the drain of the first transistor 506, and through a capacitor coupled between the gate and drain of the third transistor to the drains of both the second and third transistors 508, 516. The third transistor 516 has a channel-type different from the first and second transistors 506, 508, and in the embodiment shown is a NMOS transistor.

The first and second transistors 506, 508, and first and second current sinks 510, 512, of the 504 form a first KVL loop or first closed-loop 520. The first closed-loop 520 is operable to provide to a $V_{OUT}$ that tracks the $V_{SSHV\_REF}$ received on the input. The use of a second current source 514 generating a current half that of the first current source 502 or $0.5 \cdot I_{bias}$, instead of a diode-connected transistor 108 as shown in FIG. 1, enables the third transistor 516 in the first closed-loop 520 to provide a $V_{OUT}$ equal to $V_{SSHV\_REF}$, for $V_{SSHV\_REF}$ from 0 V to $V_{BAT}$-$V_{GS}$, where $V_{GS}$ is a gate-source voltage of the first transistor 506.

The I-sink buffer 500 further includes a smaller, second closed-loop 522 also formed in the differential amplifier 504 by the third transistor 516 and capacitor 518 or the second current sink 512, which is operable to sink at least a portion of a load current ($I_{LOAD}$) of a load 524 coupled between the output and $V_{BAT}$ to ground during spikes or transients in $I_{LOAD}$. During transients in the load current, the capacitor transforms the third transistor 516 into diode connected transistor, sinking the transient in $I_{LOAD}$ to ground. It is further noted that a bandwidth of the second closed-loop 522 is independent of the current ($I_{bias}$) of the first current source 502, enabling $I_{bias}$ to be maintained at a predetermined minimum current less than or equal to 25 nano-amperes (nA), independent of $V_{BAT}$ and $I_{LOAD}$. The load 524 charges the capacitor 518, which subsequently pulls up the gate of transistor 516 to immediately sink the load to ground. Thus, the I-sink buffer 500 harvests the current from the load 524 itself to perform the sinking instead of relying on $I_{bias}$ alone as in the conventional buffer circuits, and $I_{bias}$ is constant during both quiescent operation and load sinking.

Figure 6:
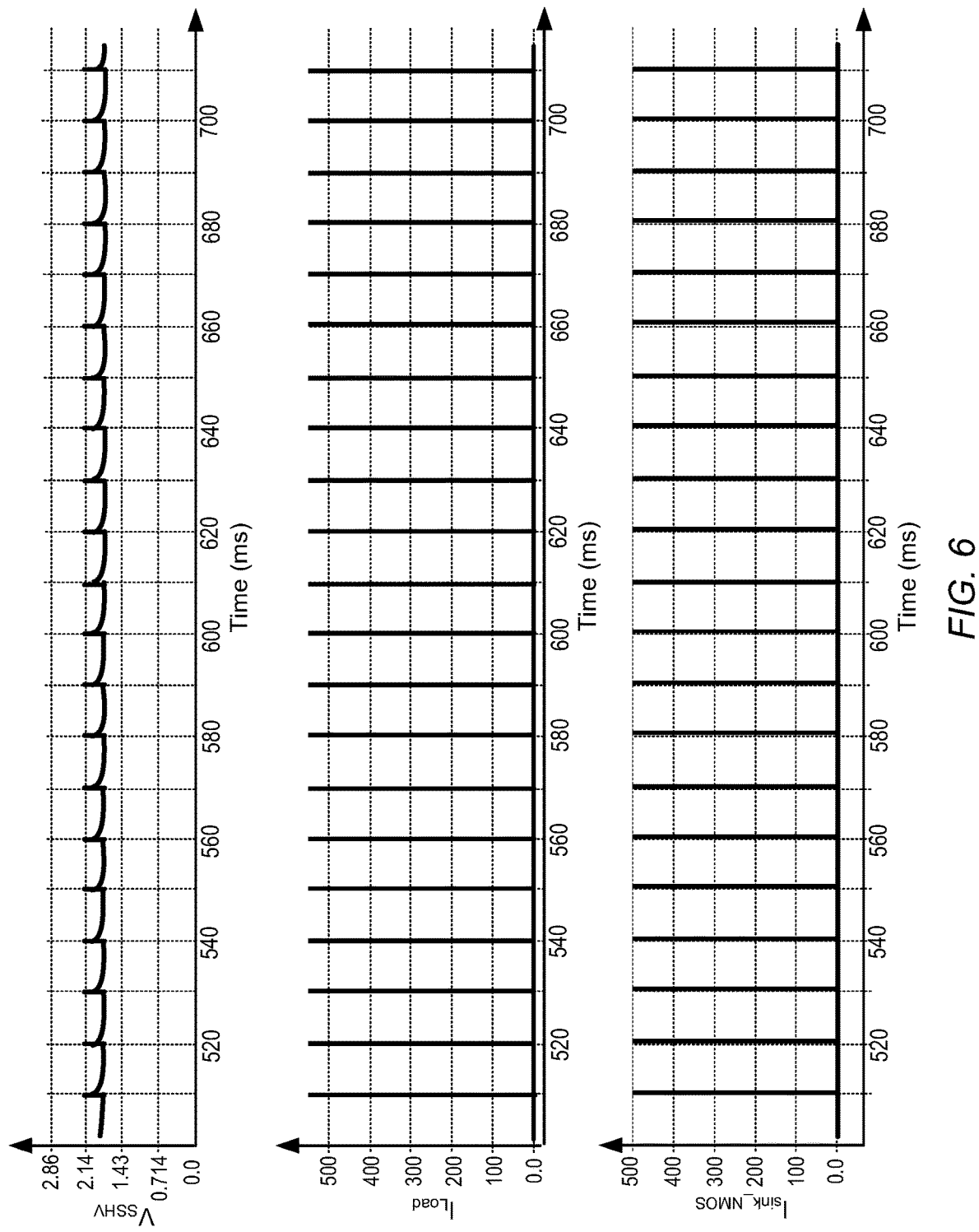
FIG. 6 includes graphs shows a floating-rail voltage ($V_{SSHV}$) output from the I-sink buffer of FIG. 5 and a sinking current ($I_{sink\_NMOS}$) versus time in response to a number of fast-transients or spikes in load current ($I_{load}$) and illustrating the ability of the circuit to sink transient currents in $I_{load}$.

FIG. 6 includes graphs shows a floating-rail voltage ($V_{SSHV}$) output from the I-sink buffer of FIG. 5 and a sinking current ($I_{sink\_NMOS}$) versus time in response to a number of fast-transient spikes or pulses in load current ($I_{load}$) and illustrating the ability of the circuit to sink transient currents in $I_{load}$. In particular, the middle graph shows the pulses in $I_{load}$, the lower graph shows the corresponding spikes or pulses in sinking current ($I_{sink\_NMOS}$), and the top graph illustrates the resultant low, brief increase in floating-rail voltage ($V_{SSHV}$), less than about 0.2 V.

Figure 7A:
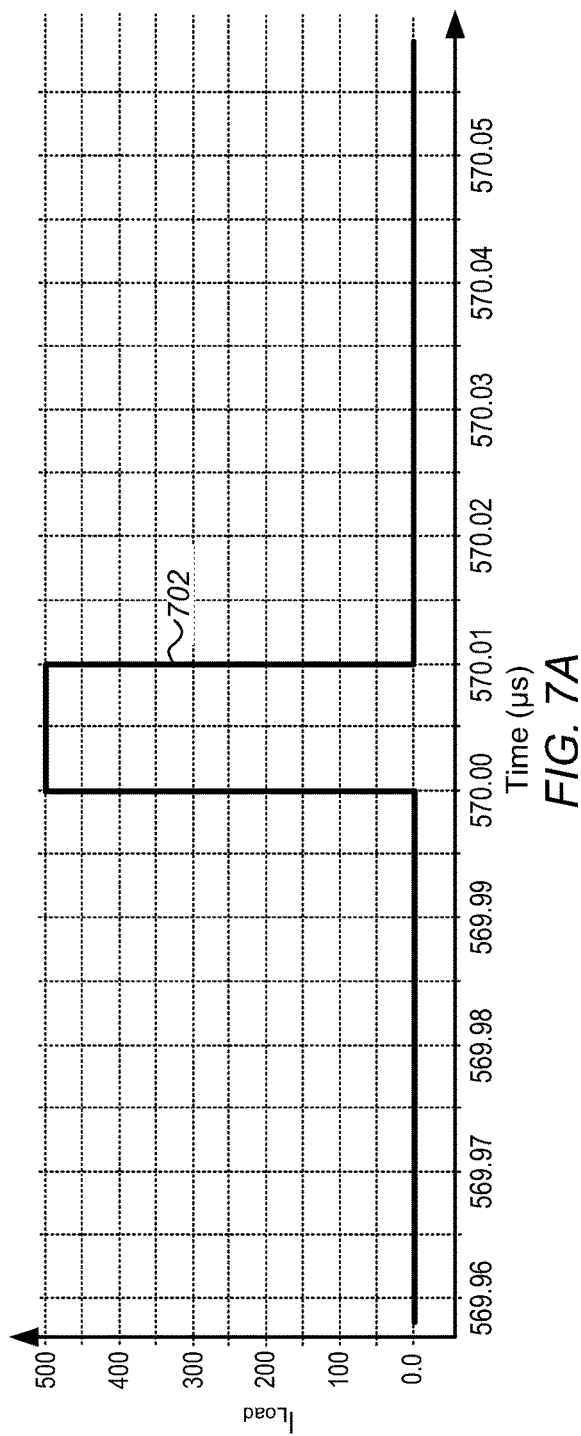
FIGS. 7A and 7B are graphs illustrating, respectively, a single spike in load current ($I_{load}$) and the resultant sinking current ($I_{sink\_NMOS}$) from the graphs of FIG. 6.
Figure 7B:
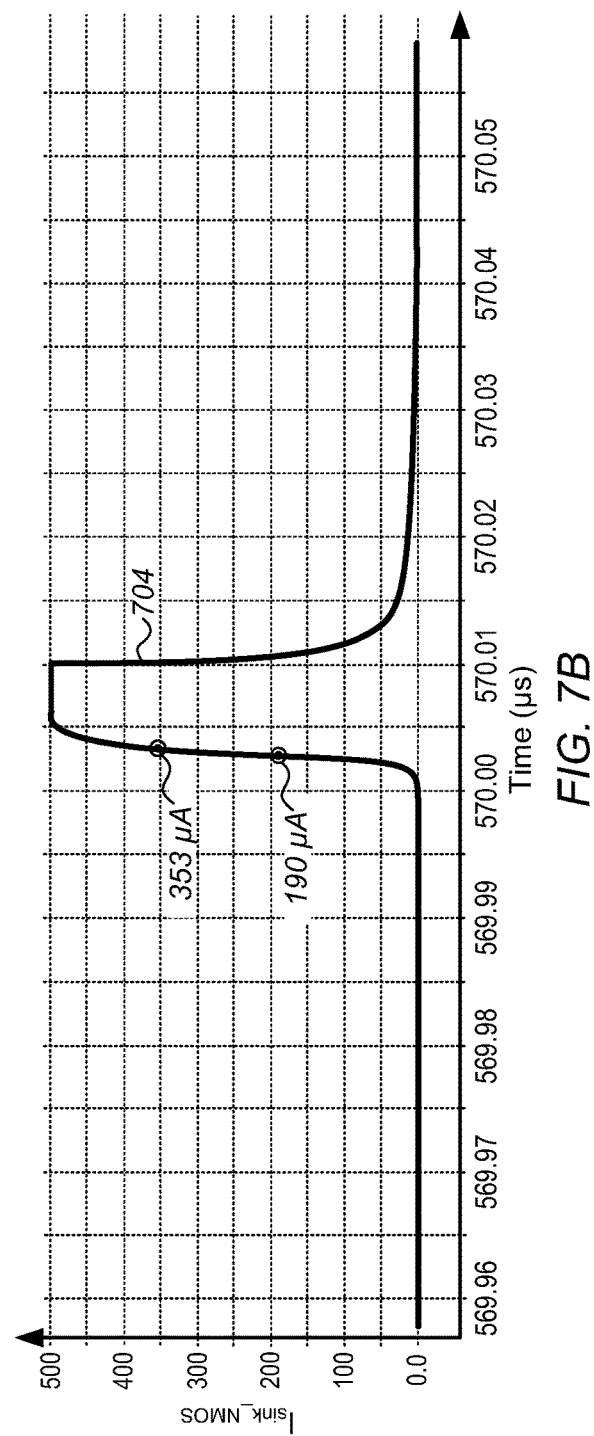

FIGS. 7A and 7B are graphs illustrating, respectively, a single pulse in load current ($I_{load}$) and the resultant sinking current ($I_{sink\_NMOS}$) from the graphs of FIG. 6 in greater detail. Referring to FIG. 7A it is seen the pulse in load current ($I_{load}$702) begins at 570 microseconds (µs), has a duration of about a 10 nanosecond (ns) and a rise in load current ($I_{load}$) from 0 to 500 µA with rise and file times of less than about 1 picosecond (ps), or about 500 amperes per microsecond (A/µs). Referring to FIG. 7B it is seen the pulse the corresponding pulse or increase in sinking current ($I_{sink\_NMOS}$704) begins shortly after the pulse in load current ($I_{load}$702) and has a sinking current of about 190 µA after about time 570.0025 µs, and a sinking current 353 µA about time 570.0035 µs, for a rise time of about 10 ps, or about 274 amperes per microsecond (A/µs). The sinking current settles at a steady current substantially equal to the pulse in load current ($I_{load}$702) of about 500 µA after which it begins to quickly fall back to a sinking current of about 0.0 µA beginning at time 570.01 µs.

Figure 8:
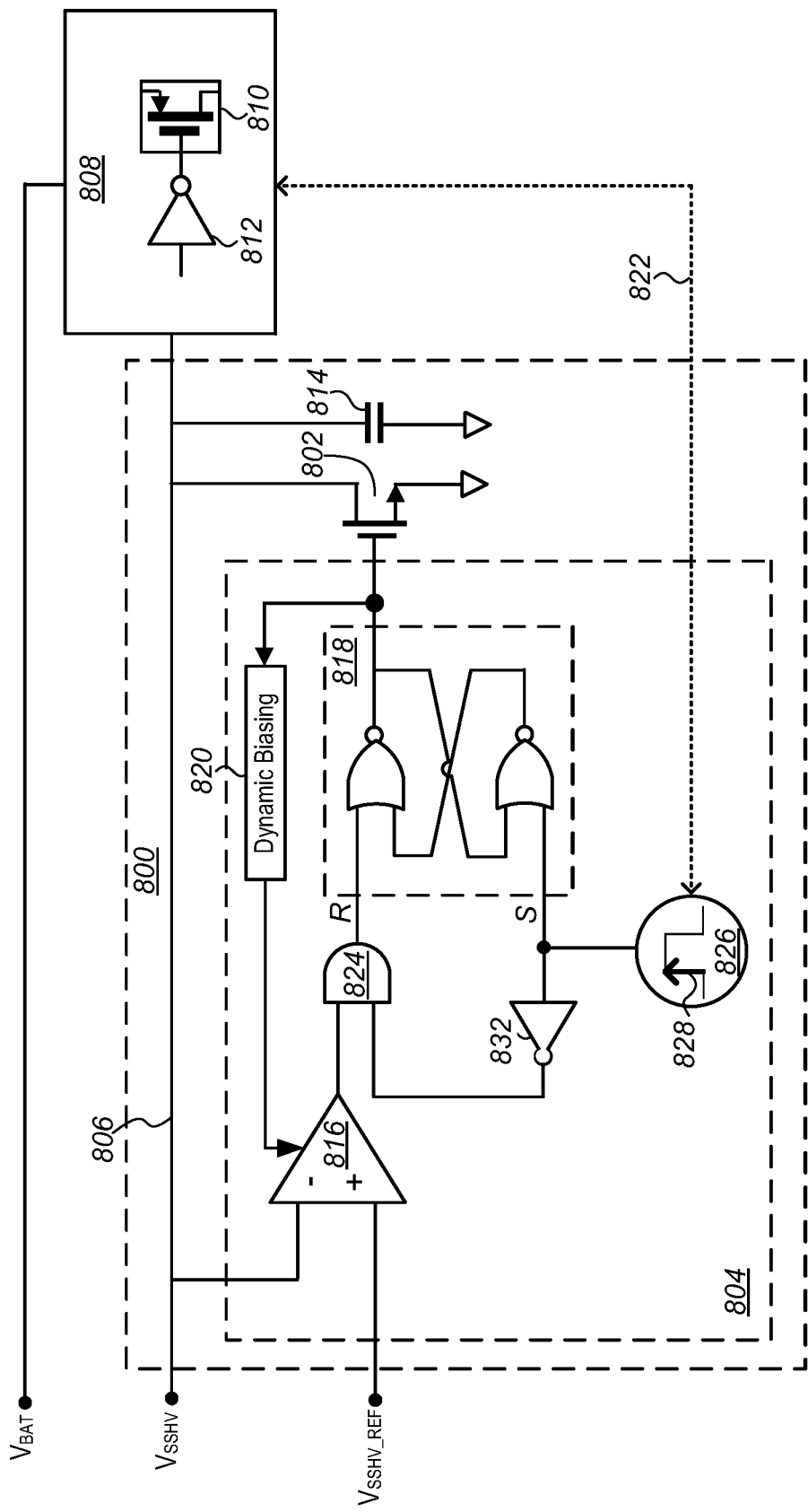
FIG. 8 is a schematic diagram of a low-power, fast-transient, large current-sink including a dynamic biasing circuit according to an embodiment of the present disclosure.

An embodiment of a current-sink 800 will now be described with reference to FIG. 8. FIG. 8 is a schematic block diagram of an embodiment of a current-sink 800. Referring to FIG. 8, the current-sink 800 generally includes a current sinking switch 802 and a dynamically controlled latch system 804. The latch system 804 has a first input coupled to a floating-rail voltage ($V_{SSHV}$) on a floating-rail 806, a second input coupled to a floating-rail reference voltage ($V_{SSHV\_REF}$), and a latch system output coupled to a control gate of the current sinking switch 802. The current sinking switch 802 further includes, in addition to the control gate, a first source/drain (S/D) terminal coupled to the floating-rail 806 and a second S/D terminal coupled to ground, and is operable to sink at least a portion of a load current ($I_{LOAD}$) from a load 808 coupled between the floating-rail and a DC input voltage ($V_{BAT}$) to provide a stable $V_{SSHV}$. The load 808 can include a High-Side Switch transistor in a switching regulator (SR), which is represented in this figure by a laterally-diffused PMOS (LDPMOS) transistor 810 and an inverter 812.

In some embodiments, such as that shown, the current-sink 800 further includes a sinking capacitor 814 coupled in parallel with the current sinking switch 802 between the floating-rail 806 and ground to sink large, fast-transients or spikes in load current.

Generally, as in the embodiment shown, the current sinking switch 802 is an n-type or n-channel MOS (NMOS) transistor.

The latch system 804 generally includes a comparator 816, a set-reset (S-R) latch 818 and a dynamic biasing circuit 820 coupled between an output of the S-R latch and the comparator. The comparator 816 has a non-inverting input coupled to $V_{SSHV\_REF}$, an inverting input coupled to the floating-rail 806, and an output coupled through a first input of a logic-gate 824 to the S-R latch 818. The S-R latch 818 has a reset input (R) coupled through an output of the logic-gate 824 to the comparator, a set input(S) coupled to a pulse generator 826 operable to receive a transient load current signal 822 from the load 808 coupled to the floating-rail and output a pulse 828 to set the S-R latch 818 on a leading edge. The S-R latch 818 further includes a latch output coupled to the control gate of the current sinking switch 802.

In some embodiments, such as that shown, the logic-gate 824 is a two input AND gate and includes a second input coupled to the pulse generator 826. The pulse generator 826 has, in addition to an input coupled to and operable to receive the transient load current signal 822, a pulse generator 826 coupled to the set(S) input of the S-R latch 818, and an inverter 832 to the second input of the logic-gate 824. The inverted pulse applies a logic '0' to the second input of the logic-gate 824, thereby ensuring that any noise or glitch generated by dynamic biasing of the comparator 816 does not result in an erroneous reset signal to the S-R latch 818. After a predetermined time equal to a pulse width of the pulse 828, a logic '1' is applied to the second input of the logic-gate 824, thereby enabling a reset signal to be coupled from the comparator 816 to the reset (R) input of the S-R latch 818 when a difference between $V_{SSHV\_REF}$ and $V_{SSHV}$ is less than a predetermined voltage.

In response to the transient load current signal 822, the pulse generator 826 outputs from the pulse generator 826 a pulse having a logic '1' to the set input(S) of the S-R latch 818. This results in a logic high, or output of about 1.8 V on the latch output, which is coupled to the gate of the current sinking switch 802 turning on the switch and connecting the floating-rail 806 to ground to sink at least a portion of the transient load current. The output pulse drives the input of the inverter 832 resulting in a pulse logic '0' being applied to the second input of the logic-gate 824. This momentarily suppresses a possible glitch from the comparator 816 applied to the reset input (R) of the S-R latch 818.

At substantially the same time a logic '1' on the output of the S-R latch 818 functions as a bias enable signal, causing the dynamic biasing circuit 820 to output one or more biasing voltages to bias inputs in the comparator 816 to output a logic high when $V_{SSHV}$ is greater than $V_{SSHV\_REF}$ by a predetermined amount. At substantially the same time a logic '1' on the output of the S-R latch 818 functions as a bias enable signal, causing the dynamic biasing circuit 820 to improve the comparator 816 response time and accuracy.

At substantially the same time a load current from load 808 begins to flow into node $V_{SSHV}$ which causes node $V_{SSHV}$ to rise above $V_{SSHV\_REF}$. This subsequently switches the comparator 816 from a marginally ON state to operating in a high-precision mode, forcing the comparator to output a logic '0' through the logic-gate 824 into the reset input (R) of the S-R latch 818. The S-R latch 818 output therefore remains high forcing the current sinking switch 802 to start sinking load current from node $V_{SSHV}$ to ground, which then causes $V_{SSHV}$ to eventually decrease below $V_{SSHV\_REF}$. When this condition occurs the dynamically biased comparator 816 asserts logic '1' thus the S-R latch 818 is reset and the current sinking switch 802 is turned-off.

Operation of the current-sink 800 in response to a transient in load current will now be described with reference to the graphs of FIGS. 9A through 9H.

Figure 9A:
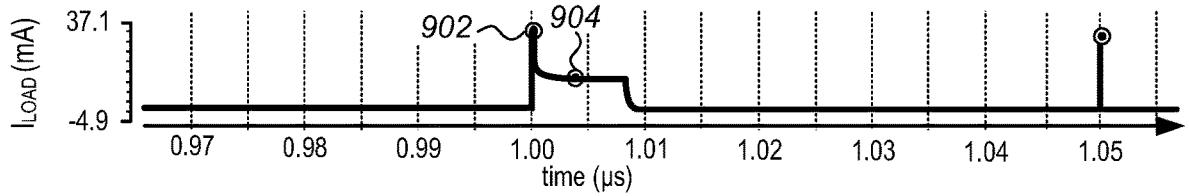
FIGS. 9A through 9H are graphs versus time of various current and voltage inputs to and resultant outputs from the current-sink of FIG. 8 during operation.

Referring to FIG. 9A, a transient in load current including a large load current spike 902 of 33.58 mA and a lower, steady load current 904 of 13.09 mA was generated on a gate of the LDPMOS transistor 810 coupled to the floating-rail 806 beginning at time of 1 µs.

Figure 9B:
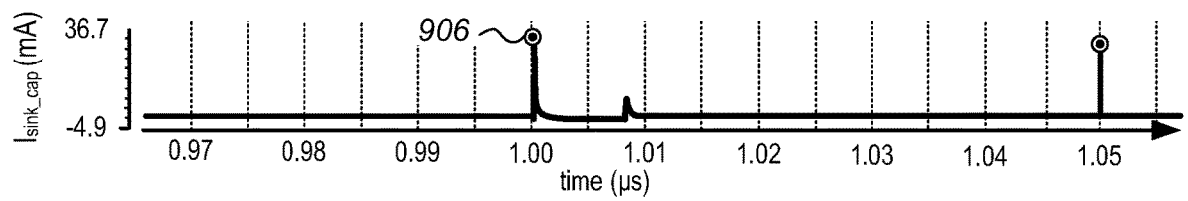

Referring to FIG. 9B the large load current spike 902 results in an immediate sinking current ($I_{sink\_cap}$ 906) through the capacitor 814 of 33.21 mA, substantially equal to the large load current spike 902 in the transient load current shown in FIG. 9A.

Figure 9C:
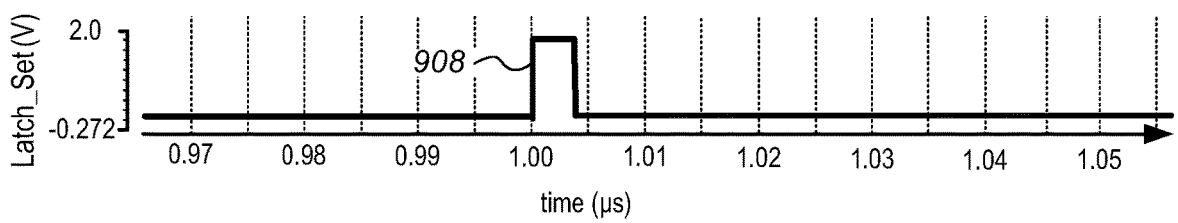

Referring to FIG. 9C, at substantially the same time a transient load current signal 822 from the load 808 causes the the pulse generator 826 to output a voltage (Latch_Set 908) of 1.8 V to the set input of the S-R latch 818. Setting the S-R latch 818 results in a logic '1' on the output of the S-R latch 818 that functions both as a bias enable signal to enable the dynamic biasing circuit 820, and as a switch gate voltage to turn on the current sinking switch 802.

Figure 9D:
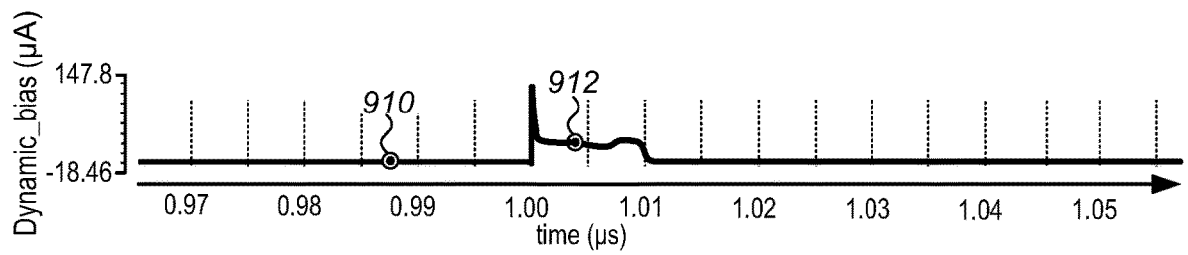

FIG. 9D illustrates the dynamic biasing current (Dynamic_bias) flowing in the dynamic biasing circuit 820 as it generates and couples one or more biasing voltages to bias inputs of the comparator 816. Referring to FIG. 9D it is noted that the dynamic biasing current increases a low initial current 910 of about 30 picoAmps (pA) to a steady current 912 of about 31.87 µA in less than 2 ns and remain high for the duration of the transient load current, shown here as about 10 ns.

Figure 9E:
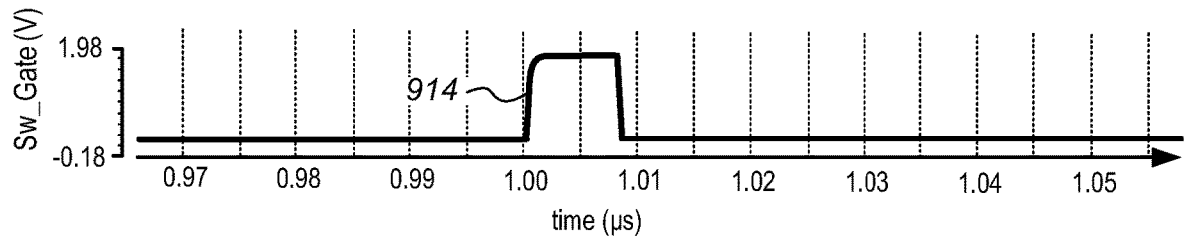

FIG. 9E illustrates the switch gate voltage (Sw_Gate 914) applied to the gate of the current sinking switch 802 from the output of the S-R latch 818. It is noted that the Sw_Gate 914 rises rapidly from an initial low voltage of about 0 V to a steady c voltage of about 1.8 V in less than 2 ns and remain high for the duration of the transient load current, shown here as about 10 ns.

Figure 9F:
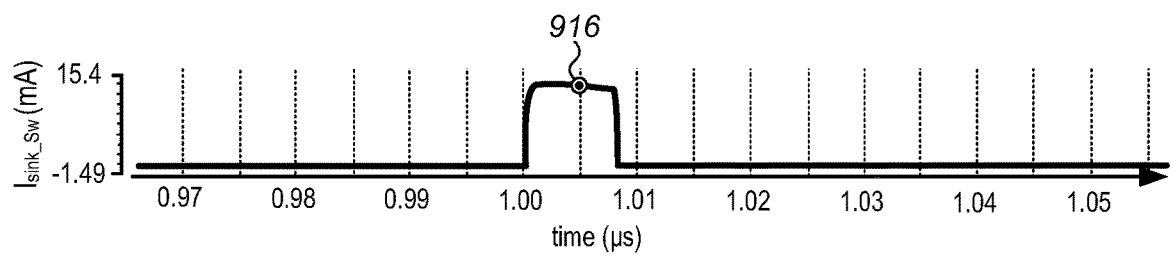

Referring to FIG. 9F it is noted that switching the current sinking switch 802 on results in a near immediate sinking current ($I_{sink\_Sw}$ 916) through the current sinking switch of about 13.70 mA, substantially equal to the steady load current 904 in the transient load current shown in FIG. 9A.

Figure 9G:
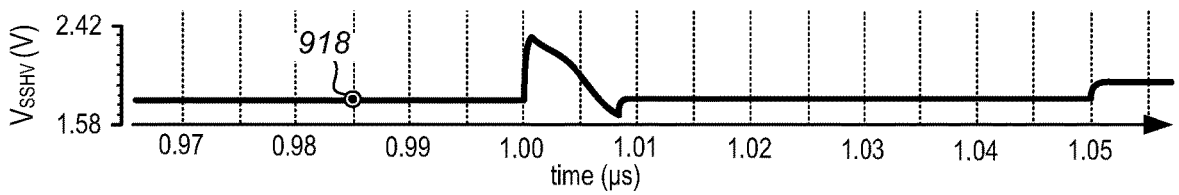

FIG. 9G illustrates the impact of the operation of the current-sink 800 in response to the transient load current on the floating-rail voltage ($V_{SSHV}$ 918). Referring to FIG. 9G it is noted that $V_{SSHV}$ starts at a low initial voltage of about 1.8 V, increasing to about 2.4 at time 1 μs after which it begins rapidly decreasing, and settles back to about 1.8 V after 9 ns at about time 1.009 μs.

Figure 9H:
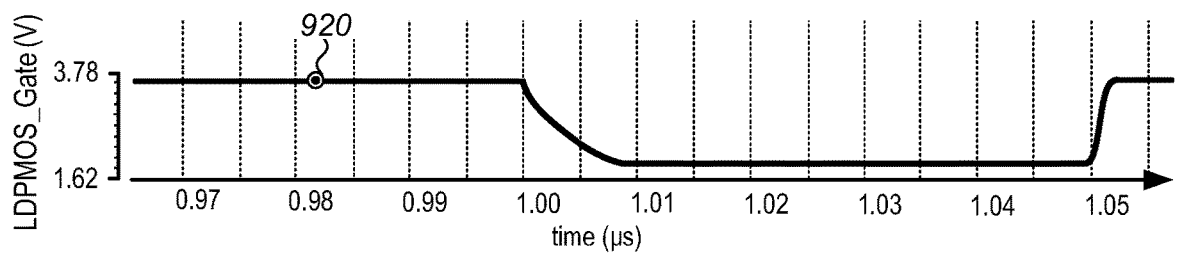

FIG. 9H illustrates the impact of the operation of the current-sink 800 in response to the transient load current on a gate voltage (LDPMOS_Gate 920) of the LDPMOS transistor 810. Referring to FIG. 9H it is noted that LDPMOS_Gate 920 starts at an initial voltage of about 3.6 V from which it begins rapidly decreasing beginning at time 1 μs to settle at a voltage of about 1.8 V in about 8.2 ns.

Figure 10:
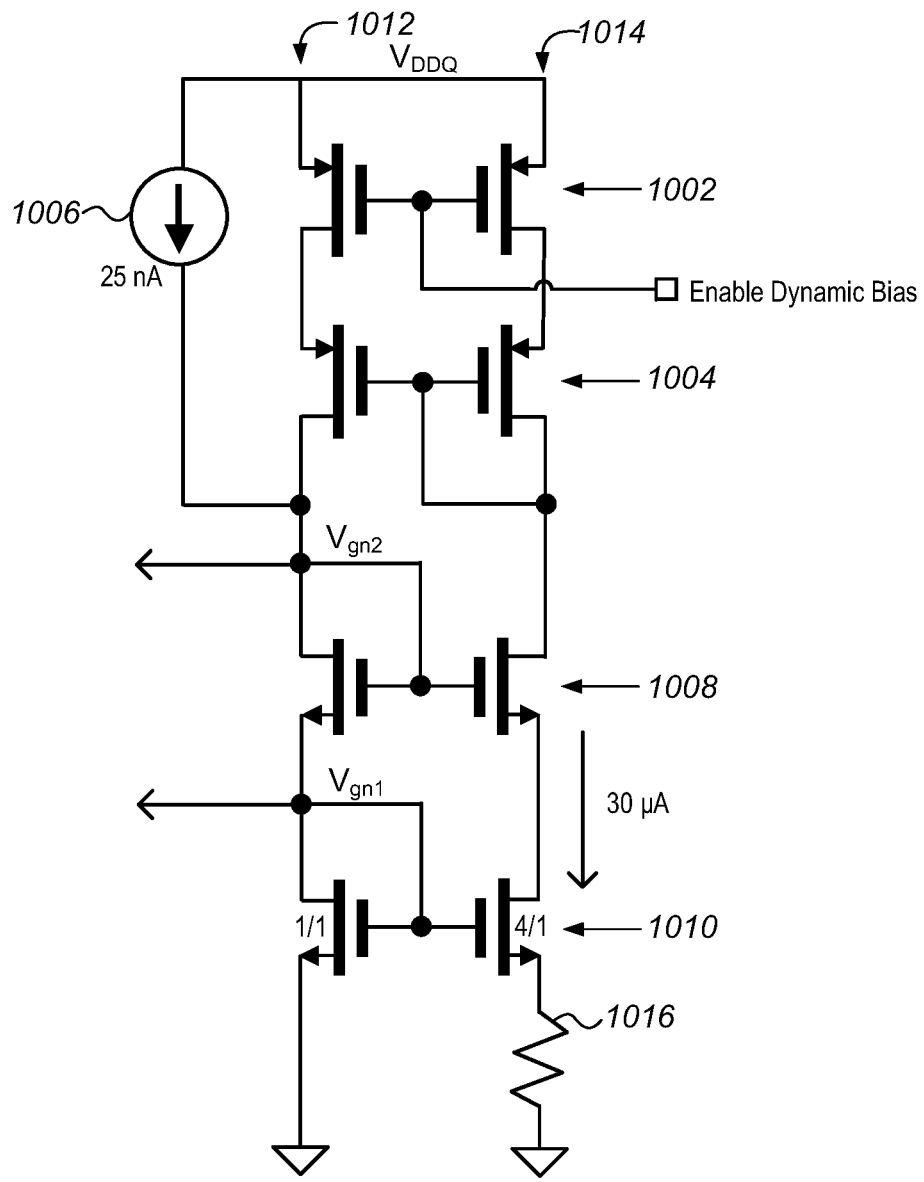
FIG. 10 is a schematic diagram of an embodiment of a dynamic biasing circuit for use in the current-sink of FIG. 8.

FIG. 10 is a schematic diagram of an embodiment of a dynamic biasing circuit for use in the current-sink of FIG. 8. Briefly, the dynamic biasing circuit 1000 is or functions as a Vgs/R current reference that is enabled only when Enable Dynamic Bias signal is set to logic '0' during the current sinking phase. When enabled the circuit produces a bias current of approximately 30 μA, otherwise it is approximately 25 nA. Referring to FIG. 10, dynamic biasing circuit 1000 includes two pairs of PMOS transistors 1002, 1004, coupled in parallel with a current source 1006 between a voltage supply ($V_{DDQ}$) and through two pairs of NMOS transistors 1008, 1010, to ground. The first pair of PMOS transistors 1002 operate as a switch to turn on the dynamic biasing circuit 1000 when the enable dynamic bias signal is received. In operation, when the enable dynamic bias signal is not present the current source 1006 raises gate voltages of the two pairs of NMOS transistors 1008, 1010, at nodes $V_{gn1}$ and $V_{gn2}$ above ground, pre-biasing the NMOS transistors, and thereby enabling a very fast turn-on time for the dynamic biasing circuit 1000. When the enable dynamic bias signal is received the first pair of PMOS transistors 1002 are turned-on causing a current flow through first and second legs 1012, 1014, of the dynamic biasing circuit 1000 and turning on the second pair of PMOS transistors 1004, which function as a current mirror to ensure equal current flow the PMOS transistors in both the first and second legs 1012, 1014. The increased current quickly turns-on the two pairs of NMOS transistors 1008, 1010, which then operate as a cascode current mirror passing a 30 μA current through a large resistor 1016 in the second leg 1014 of the dynamic biasing circuit 1000, and generating voltages on nodes $V_{gn1}$ and $V_{gn2}$ to dynamically bias the comparator 816 from barely on to a high-precision mode. By high-precision it is meant that the comparator 816 is operable to detect differences between $V_{SSHV\_REF}$ and $V_{SSHV}$ of about 1 mV, or less with 1 ns propagation delay. Referring again to FIG. 10, applying Kirchhoff's Voltage Law (KVL) a $V_{GS}$ of the left transistor (1/1) of the second pair of NMOS transistors 1010, equals a $V_{GS}$ of the right transistor (4/1) plus the voltage across resistor 1016. Larger device ratio of the right transistor (4/1) indicates a smaller $V_{GS}$, than the $V_{GS}$ of the left transistor (1/1) for the same drain currents.

Figure 11:
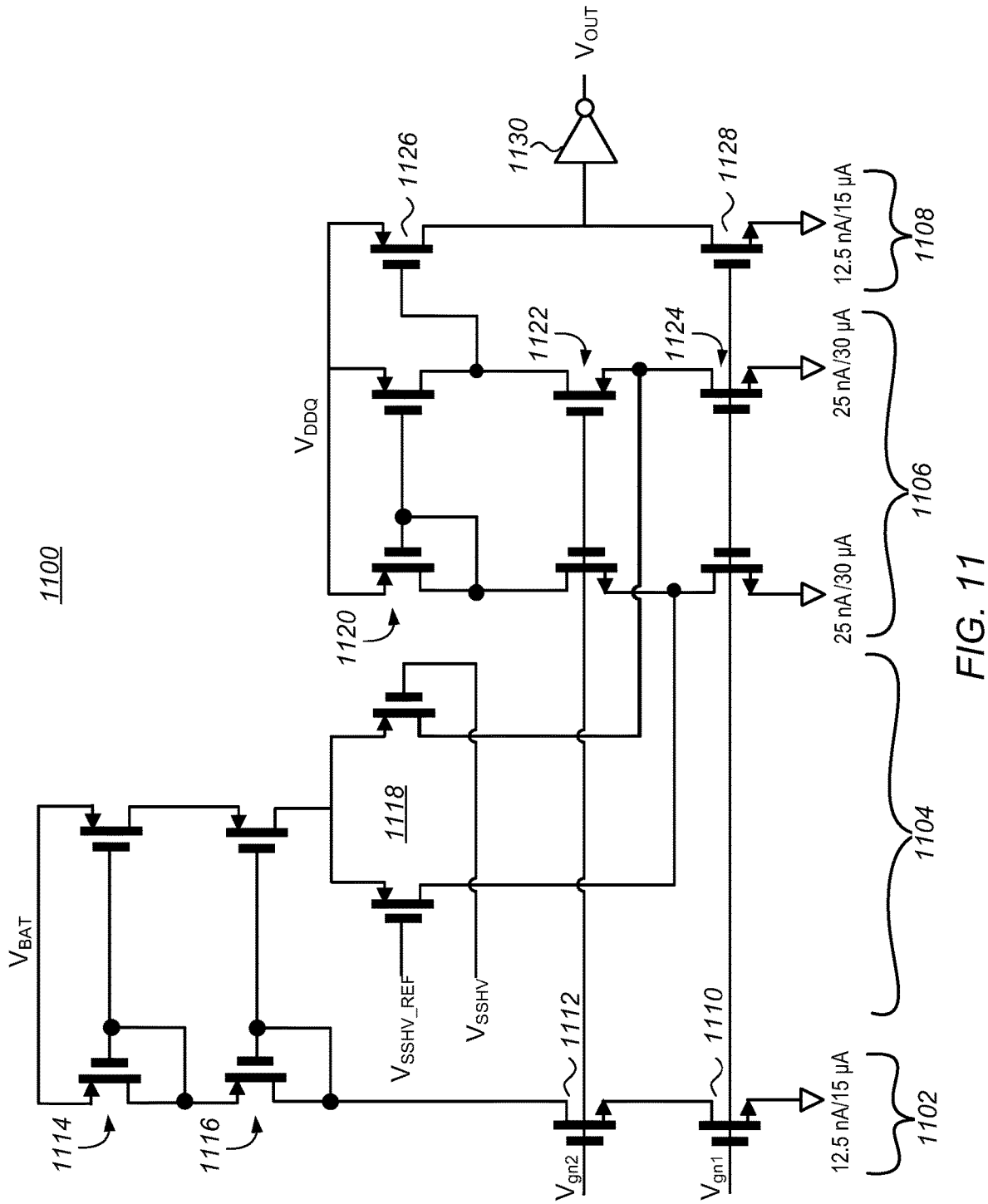
FIG. 11 is a schematic diagram of an embodiment of a comparator for use in the current-sink of FIG. 8.

FIG. 11 is a schematic diagram of an embodiment of a comparator for use in the current-sink of FIG. 8. Referring to FIG. 11, the comparator 1100 has a folded-cascode topology including a biasing stage 1102, an input stage 1104, a cascode stage 1106, and an output buffer 1108. NMOS transistors 1110 and 1112, receive the voltages $V_{gn1}$ and $V_{gn2}$ from the dynamic biasing circuit 1000, and through first and second current mirrors 1114, 1116 when dynamic biasing is enabled increase a voltage applied to a PMOS amplifier 1118 in the input stage 1104, thereby increasing gain of the PMOS amplifier and improving sensitivity and accuracy of the comparator 1100.

The cascode stage 1106 generally includes a PMOS current mirror 1120 coupled to a voltage supply ($V_{DDQ}$), and first and second pairs of NMOS transistors 1122, 1124, coupled between the PMOS current mirror and ground and configured to amplify an output from the input stage 1104. The output buffer 1108 includes series connected PMOS and NMOS transistors 1126, 1128, and an inverter 1130. The PMOS transistor 1126 has a source coupled to $V_{DDQ}$, a drain coupled ground through the NMOS transistor 1128, and a gate coupled to receive an output from the cascode stage 1106. The NMOS transistor 1128 has a drain coupled to $V_{DDQ}$, through the PMOS transistor 1126, a source coupled ground and a gate coupled to receive the voltage $V_{gn1}$. Like the biasing stage 1102 and the input stage 1104, the biasing current of the cascode stage 1106 and output buffer 1108 is also increased when the dynamic biasing is enabled, and thus the propagation delay of the comparator 1100 is reduced accordingly to ensure precise timing to turn off current sinking switch 802 at the end of current sinking phase. In particular, it is noted that as shown in FIG. 11, the biasing current of all stages 1102, 1104, and 1106 and the output buffer 1108 is increased when the dynamic biasing is enabled from a quiescent current of about 12.5 nA to about 30 μA.

Figure 12:
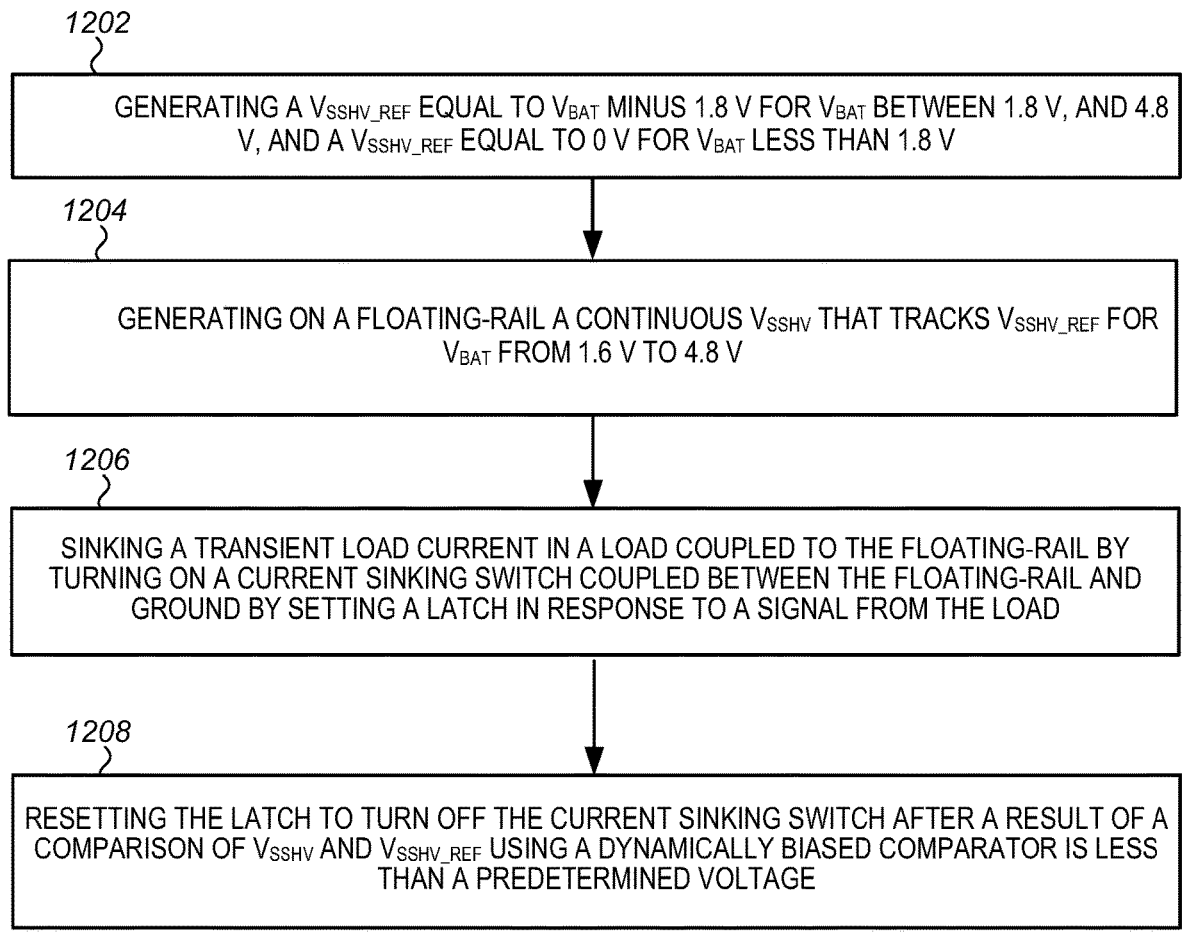
FIG. 12 is a flowchart illustrating a method for operating a switching regulator (SR) including a low power, continuous-rail architecture.

FIG. 12 is a flowchart illustrating a method for operating a switching regulator (SR) including a low power, continuous-rail architecture. Referring to FIG. 12, the method generally begins with generating a $V_{sshv\_ref}$ equal to $V_{bat}$ minus 1.8 V for $V_{bat}$ between 1.8 V, and 4.8 V, and a $V_{sshv\_ref}$ equal to 0 V for $V_{bat}$ less than 1.8 V (step 1202). Next, a continuous $V_{sshv}$ is generated that tracks $V_{sshv\_ref}$ for $V_{bat}$ from 1.6 V to 4.8 V (step 1204). A transient load current in a load coupled to the floating-rail is sunk by turning on a current sinking switch coupled between the floating-rail and ground by setting a latch in response to a signal from the load (step 1206). Finally, the latch is reset to turn off the current sinking switch after a result of a comparison of $V_{sshv}$ and $V_{sshv\_ref}$ using a dynamically biased comparator is less than a predetermined voltage and a predetermined time has passed (step 1208). Generally, as explained above the predetermined voltage is about 0 V, and the predetermined time is equal to a time corresponding to the pulse width.

Figure 13:
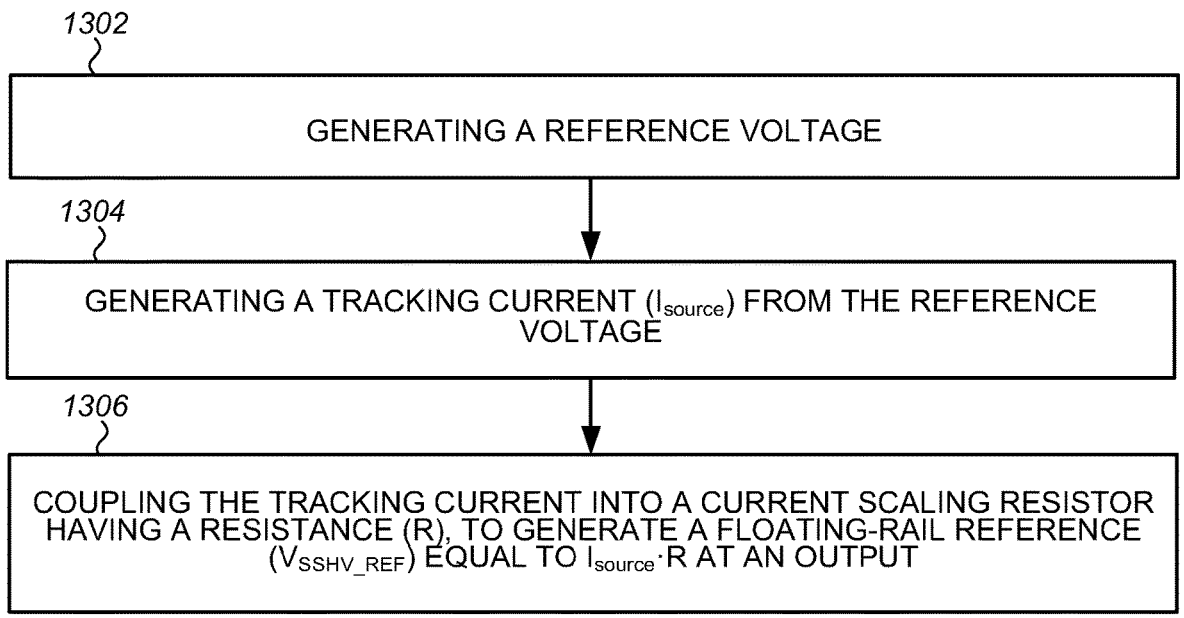
FIG. 13 is a flowchart illustrating a method for operating a low power floating-rail reference generator.

FIG. 13 is a flowchart illustrating a method for operating a low power floating-rail reference generator. Referring to FIG. 13, the method generally includes generating a reference voltage (step 1302); generating a tracking current ($I_{source}$) from the reference voltage (step 1304); and coupling the tracking current into a current scaling resistor having a resistance (R), to generate a floating-rail reference voltage ($V_{SSHV\_REF}$) equal to $I_{source}\cdot R$ at an output (step 1306).

Generally, as described above with respect to FIG. 3, generating the tracking current (step 1304) is accomplished by controlling a pair of MOS transistors including a first transistor with a source coupled to the input voltage ($V_{BAT}$) and a drain coupled to the output, and a second transistor coupled to $V_{BAT}$, using a differential amplifier with an output coupled to gates of the first and second transistors. The differential amplifier includes an inverting input coupled to $V_{BAT}$ through a first resistor (R1) of a voltage divider and to ground through a second resistor (R2) of the voltage divider, and a non-inverting input coupled to a node between a drain of the second transistor and a third resistor (R3) through which the node is coupled to ground.

In embodiments, such as described in FIG. 3, the floating-rail reference generator further includes a current source having a current ($I_1$), and generating the reference voltage (step 1302) includes generating an input to the non-inverting input of the differential amplifier by coupling the non-inverting input of the differential amplifier to $V_{BAT}$ through the current source.

Figure 14:
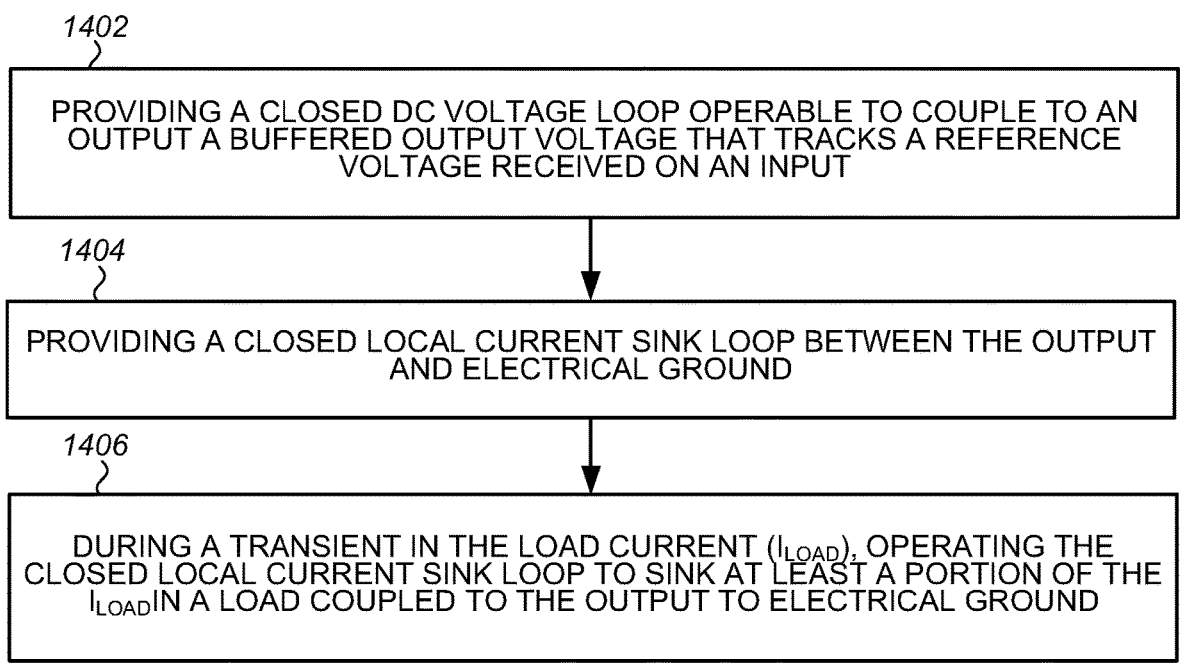
FIG. 14 is a flowchart illustrating a method for operating a low-power, fast-transient I-sink buffer of the present disclosure.

FIG. 14 is a flowchart illustrating a method for operating a low-power, fast-transient I-sink buffer to sink transients in a load current. Referring to FIG. 14, the method generally includes providing a closed DC voltage loop operable to couple to an output a buffered output voltage ($V_{OUT}$) that tracks a reference voltage ($V_{SSHV\_REF}$) received on an input (step 1402); providing a closed local current sink loop between the output and ground (step 1404); and during a transient in the load current ($I_{LOAD}$), operating the closed local current sink loop to sink at least a portion of the $I_{LOAD}$ in a load coupled to the output to ground (step 1406).

Generally, as described above with respect to FIG. 5, providing the closed DC voltage loop (step 1402) is accomplished by providing a first transistor with a gate coupled to the input, and a source coupled to an input voltage ($V_{BAT}$) through a first current source; providing a second transistor matched to the first transistor, where the second transistor is diode connected with a gate coupled to a drain and to the output, and a source coupled to the first current source and to the source of the first transistor; providing a first current sink through which a drain of the first transistor is coupled to ground; and providing a second current sink through which the drain of the second transistor is coupled to ground.

Providing the closed local current sink loop (step 1404) is accomplished by providing a second current sink including a third transistor with a channel-type different from the first and second transistors, the third transistor having a source coupled to ground, a drain coupled to the drain of the second transistor, and a gate coupled to the drain of the first transistor, and a capacitor coupled between the gate and drain of the third transistor.

Figure 15:
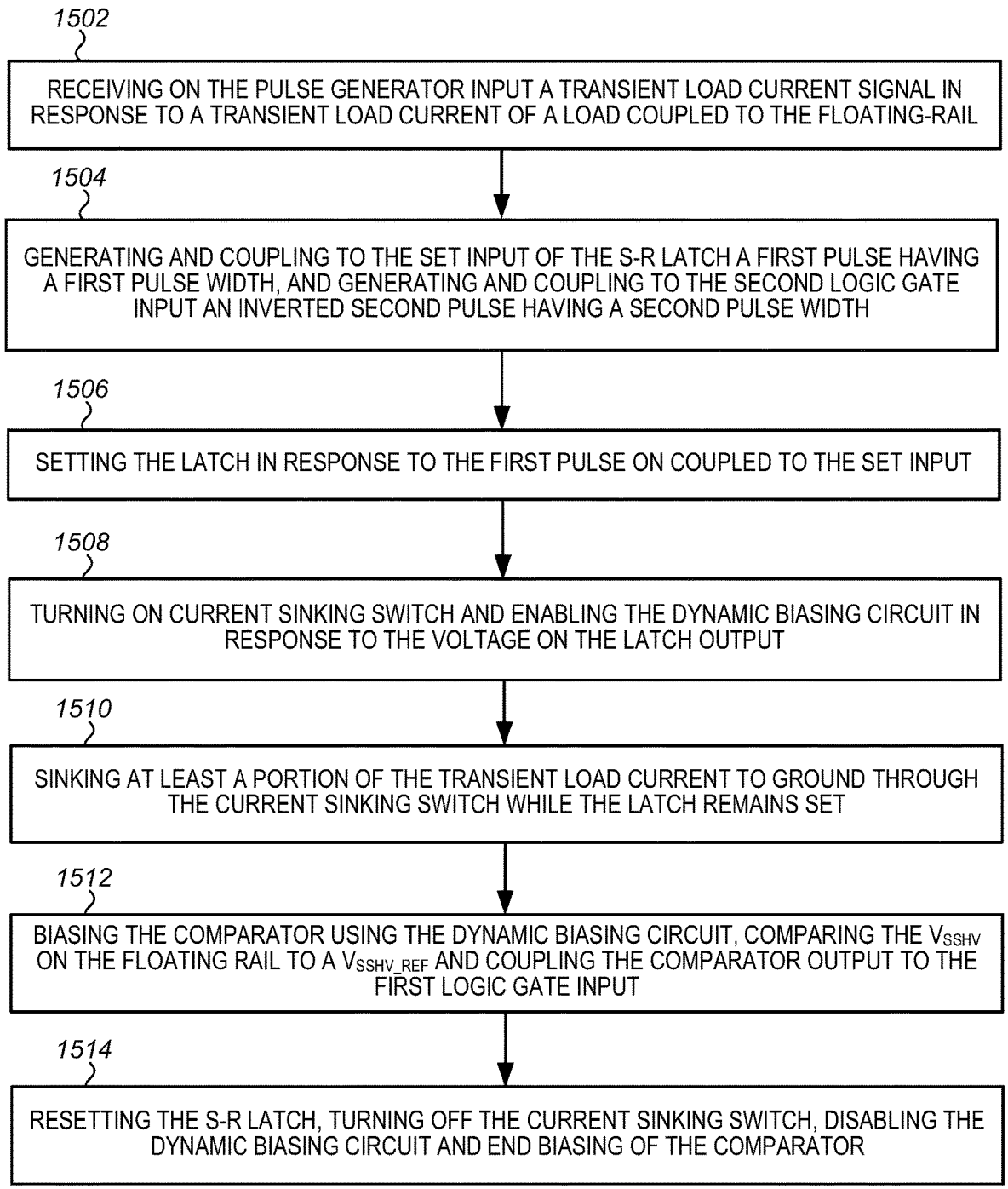
FIG. 15 is a flowchart illustrating a method for operating the current-sink of FIG. 8.

FIG. 15 is a flowchart illustrating a method for operating the current-sink of FIG. 8 to sink a transient load current. Referring to FIGS. 8 and 15, the method generally begins with receiving on the input the pulse generator 826 a transient load current signal 822 in response to a transient load current of a load 808 coupled to the floating-rail 806 (step 1502). Where the transient in load current includes a large load current spike and a lower, steady load current, the method also begins with sinking the large load current spike through the capacitor 814 to ground.

Next, a pulse 828 having a pulse width is generated and coupled to the set input(S) of the S-R latch 818, and the inverted pulse coupled to the second logic-gate input of logic-gate 824 (step 1504). It will be understood from the above description of FIG. 8, that the S-R latch 818 will remained latched after the pulse ends until a voltage or logic '1' is applied to the reset input from the logic-gate 824. It will further by understood that the pulse coupled through the inverter 832 is a logic '0', effectively ensuring that the output from the comparator 816 is not coupled to the reset input (R) of the S-R latch 818 until at least after a time corresponding to the pulse width.

The S-R latch 818 is then set in response to the pulse coupled to the set input (step 1506), and the voltage on the latch output of the set S-R latch 818 turns on the current sinking switch 802 and enables the dynamic biasing circuit 820 (step 1508). At least a portion of the transient load current is sunk to ground through the current sinking switch 802 while the S-R latch 818 remains set (step 1510).

Next, the comparator 816 is biased or enabled using the dynamic biasing circuit 820, the floating-rail voltage ($V_{SSHV}$) on the floating-rail 806 compared to the floating-rail reference voltage ($V_{SSHV\_REF}$) and the comparator output coupled to the first logic-gate input of the logic-gate 824 (step 1512).

Finally, after a time corresponding to the pulse width has passed so that logic '1' is on the second input of the logic-gate 824, if the comparator 816 output has reached a voltage corresponding to a logic '1', the logic-gate will output a logic '1' to the reset input to reset the S-R latch 818, turning off the current sinking switch 802, disabling the dynamic biasing circuit 820 and end biasing of the comparator (step 1514).

Figure 16:
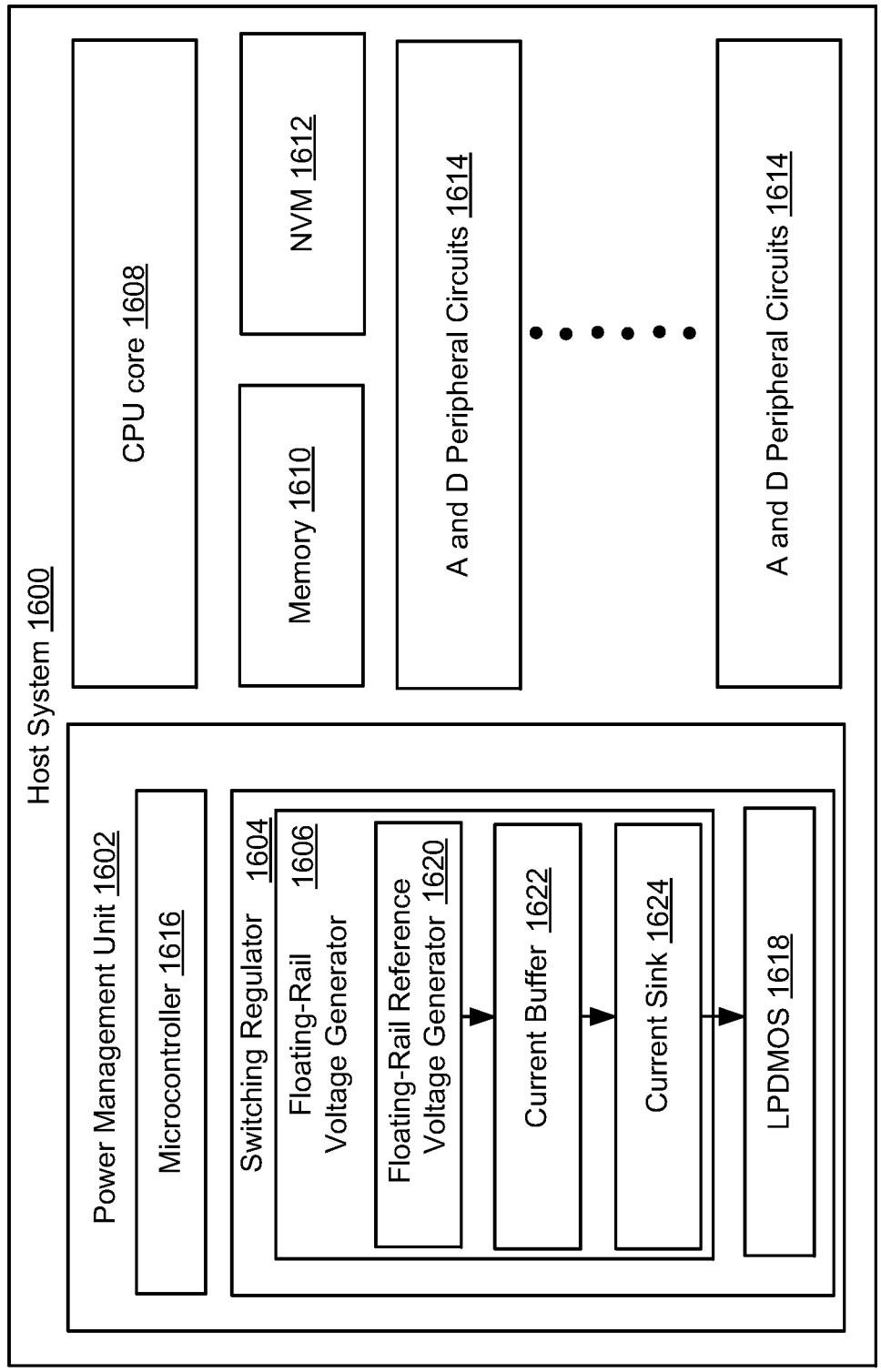
FIG. 16 is block diagram of a host system having a power management unit (PMU) with a switching regulator (SR) for which the floating-rail reference generator of the present disclosure is particularly useful.

FIG. 16 is block diagram of a host system 1600 having a power management unit (PMU 1602) with a switching regulator (SR 1604) for which the floating-rail voltage generator 1606 of the present disclosure is particularly useful.

Referring to FIG. 16, the host system 1600 is generally a microcontroller unit (MCU) or programmable systems on a chip (PSoC) and can include a CPU core 1608, volatile memory 1610 and non-volatile memory (NVM 1612), and a number of configurable integrated analog and digital peripheral circuits 1614. Such MCUs are widely used in many automotive, and portable or non-portable electronic applications. Exemplary applications can include Bluetooth radios, and Wi-Fi hubs or receivers. The PMU can include, in addition to the SR 1604, a microcontroller 1616 that controls the SR 1604 and governs power functions of host system 1600.

The SR 1604 is operable to convert a voltage from a battery or other DC power source into output voltages required by other subsystems or devices in the host system 1600. The SR 1604 generally includes a high-side switching transistor, such as a laterally-diffused PMOS (LDPMOS) transistor 1618, controlled by or receiving a floating-rail voltage ($V_{SSHV}$) from a floating-rail voltage generator 1620 to supply the required output voltages. The floating-rail voltage generator 1606 generally includes a floating-rail reference generator 1620 to generate $V_{SSHV\_REF}$, a current-sinking (I-sink) buffer 1622 to sink small transients and buffer $V_{SSHV}$, and a dynamically biased current-sink 1624 to sink larger transients in the load current.

Thus, a SR including a constant, floating-rail voltage generator and methods of operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A switching regulator comprising:
a floating-rail reference generator operable to generate a floating-rail reference voltage ($V_{SSHV\_REF}$);
a current-sinking (I-sink) buffer coupled between an input voltage ($V_{BAT}$) and ground, the I-sink buffer operable to receive the $V_{SSHV\_REF}$ and generate a floating-rail voltage ($V_{SSHV}$) on a floating-rail in the switching regulator; and
a high-side switching transistor including a source and a drain coupled between $V_{BAT}$ and ground, and a gate coupled to the floating-rail,
wherein the floating-rail reference generator is operable to generate a $V_{SSHV\_REF}$ equal to $V_{BAT}$–1.8 V for $V_{BAT}$ between 1.8 V and 4.8 V, and a $V_{SSHV\_REF}$ equal to 0 V for $V_{BAT}$ less than 1.8 V.

2. The switching regulator of claim 1 wherein the floating-rail reference generator comprises:
a current scaling resistor coupled between a $V_{SSHV\_REF}$ output and ground;
a pair of MOS transistors including a first transistor having a source coupled to $V_{BAT}$ and a drain coupled to the $V_{SSHV\_REF}$ output, and a second transistor having a source coupled to $V_{BAT}$;
a differential amplifier having an amplifier output coupled to gates of the first and second transistors and operable to control the first and second transistors, the differential amplifier comprising:
an inverting input coupled to $V_{BAT}$ through a first resistor of a voltage divider and to ground through a second resistor of the voltage divider; and
a non-inverting input coupled to a drain of the second transistor and to ground through a third resistor.

3. The switching regulator of claim 2 wherein the floating-rail reference generator further comprises a reference current source ($I_1$) through which the non-inverting input, drain of the second transistor and the third resistor are coupled to $V_{BAT}$, and wherein:

$$I_1 = V_{GS}\left(\frac{R_1 + R_2}{R_2}\right)$$

where $V_{GS}$ is a preselected maximum gate-source voltage, $R_1$ is the resistance of the first resistor, and $R_2$ is the resistance of the second resistor.

4. The switching regulator of claim 1 wherein the I-sink buffer is operable to enable continuous generation of $V_{SSHV}$ with $V_{BAT}$ from 1.6 V to 4.8 V.

5. The switching regulator of claim 4 wherein the I-sink buffer comprises a one-stage differential amplifier including a first closed-loop operable to generate a $V_{SSHV}$ that tracks $V_{SSHV\_REF}$ received on a $V_{SSHV\_REF}$ input, and a second closed-loop operable to sink to ground at least a portion of a load current ($I_{LOAD}$) to the high-side switching transistor during transients in the load current.

6. The switching regulator of claim 5 wherein the I-sink buffer further comprises a first current source coupled to $V_{BAT}$ and operable to generate a biasing current ($I_{bias}$), and wherein the one-stage differential amplifier is coupled to $V_{BAT}$ through the first current source.

7. The switching regulator of claim 6 wherein the first closed-loop comprises:
a first transistor with a gate coupled to the $V_{SSHV\_REF}$ input, and a source coupled to the first current source;
a second transistor matched to the first transistor, where the second transistor is diode connected with a gate coupled to a drain and to a $V_{SSHV}$ output, and a source coupled to the first current source and to the source of the first transistor;
a first current sink through which a drain of the first transistor is coupled to ground; and
a second current sink through which the drain of the second transistor is coupled to ground.

8. The switching regulator of claim 7 wherein the second current sink
a third transistor with a channel-type different from the first and second transistors, the third transistor having a source coupled to ground, a drain coupled to the drain of the second transistor, and a gate coupled to the drain of the first transistor; and
a capacitor coupled between the gate and drain of the third transistor.

9. The switching regulator of claim 8 wherein the second closed-loop comprises the third transistor and the capacitor coupled between the gate and drain of the third transistor.

10. The switching regulator of claim 9 wherein during transients in the load current, the capacitor transforms the third transistor into diode connected transistor, sinking the transient in $I_{LOAD}$ to ground.

11. The switching regulator of claim 1 further comprising a current-sink coupled to the floating-rail, the current-sink comprising:
a latch system including a latch system input coupled to and operable to receive a signal indicating a transient load current in a load current of the gate of the high-side switching transistor coupled to the floating-rail, and a latch system output; and
a current sinking switch including a gate coupled to the latch system output, a first source/drain (S/D) terminal coupled to the floating-rail, and a second S/D terminal coupled to ground, the current sinking switch operable to sink at least a portion of the transient load current from the load to provide a stable $V_{SSHV}$ on the floating-rail.

12. The switching regulator of claim 11 wherein the current-sink further comprises a sinking capacitor coupled in parallel with the current sinking switch between the floating-rail and ground, wherein the transient load current includes a current spike and a lower, steady current, and wherein the sinking capacitor is operable to sink the current spike in transients load current to ground, and the current sinking switch is operable to sink the lower, steady current of the transient load current.

13. The switching regulator of claim 11, wherein the latch system comprises:
a comparator having a non-inverting input coupled to $V_{SSHV\_REF}$, and an inverting input coupled to $V_{SSHV}$ on the floating-rail, and a comparator output; and
a set-reset (S-R) latch having a set input coupled to and operable to receive the transient load current signal from the latch system input, a reset input coupled to the comparator output, and a latch output coupled to the latch system output.

14. The switching regulator of claim 13, wherein the latch system further comprises a dynamic biasing circuit coupled between the latch output and biasing voltage inputs to the comparator, the dynamic biasing circuit operable to receive a bias enable signal from the latch output and bias the comparator to increase an output therefrom to reset the S-R latch.

15. The switching regulator of claim 14, wherein the latch system further comprises:
   a logic-gate including a logic-gate output coupled to the reset input of the S-R latch, a first logic-gate input coupled to the comparator output and a second logic-gate input; and
   a pulse generator including a pulse generator input operable to receive the transient load current signal, a pulse generator output coupled to a set input of the S-R latch, and through an inverter to the second logic-gate input of the logic-gate,
   wherein the pulse generator is operable in response to the transient load current signal to output a pulse to set the S-R latch.

16. The switching regulator of claim 15, wherein the pulse generator and the inverter are operable to output a logic '1' to the second logic-gate input after the pulse has ended.

17. The switching regulator of claim 16, wherein the comparator is operable to output a logic '1' to the first logic-gate input when a difference between $V_{SSHV\_REF}$ and $V_{SSHV}$ is less than a predetermined voltage, resetting the set the S-R latch and turning off the current sinking switch.

18. A floating-rail voltage generator comprising:
   a floating-rail reference generator operable to generate a floating-rail reference voltage ($V_{SSHV\_REF}$) equal to an input voltage ($V_{BAT}$) minus 1.8 V for $V_{BAT}$ between 1.8 V and 4.8 V, and a $V_{SSHV\_REF}$ equal to 0 V for $V_{BAT}$ less than 1.8 V;
   a current-sinking (I-sink) buffer coupled between $V_{BAT}$ and ground, the I-sink buffer operable to receive the $V_{SSHV\_REF}$ and generate a continuous floating-rail voltage ($V_{SSHV}$) on a floating-rail for $V_{BAT}$ between 1.6 V and 4.8 V; and
   a current sink operable to receive $V_{SSHV\_REF}$ and $V_{SSHV}$ and to turn on a current sinking switch coupled between the floating-rail and ground by setting a set-reset (S-R) latch having a latch output coupled to a gate of the current sinking switch when a transient load current signal is received from a load coupled to the floating-rail.

19. The floating-rail voltage generator of claim 18 wherein the current sink further comprises a comparator operable to compare $V_{SSHV\_REF}$ and $V_{SSHV}$, and a dynamic biasing circuit operable to bias the comparator when the transient load current signal is received, and wherein current sink is further operable to reset the S-R latch after a predetermined time and when a difference between $V_{SSHV\_REF}$ and $V_{SSHV}$ is less than a predetermined voltage.

20. A method of generating a floating-rail voltage ($V_{SSHV}$) comprising:
   generating a floating-rail reference voltage ($V_{SSHV\_REF}$) equal to an input voltage ($V_{BAT}$) minus 1.8 V for $V_{BAT}$ between 1.8 V, and 4.8 V, and a $V_{SSHV\_REF}$ equal to 0 V for $V_{BAT}$ less than 1.8 V;
   generating on a floating-rail a continuous $V_{SSHV}$ that tracks $V_{SSHV\_REF}$ for $V_{BAT}$ from 1.6 V to 4.8 V; and
   sinking a transient load current in a load coupled to the floating-rail by turning on a current sinking switch coupled between the floating-rail and ground by setting a latch in response to a signal from the load, and resetting the latch to turn off the current sinking switch after a result of a comparison of $V_{SSHV}$ and $V_{SSHV\_REF}$ using a dynamically biased comparator is less than a predetermined voltage.

* * * * *